(12) United States Patent
Osada

(10) Patent No.: US 12,355,436 B2
(45) Date of Patent: Jul. 8, 2025

(54) GATE DRIVER, INSULATION MODULE, LOW-VOLTAGE CIRCUIT UNIT, AND HIGH-VOLTAGE CIRCUIT UNIT

(71) Applicant: ROHM CO., LTD., Kyoto (JP)

(72) Inventor: Kosei Osada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 19 days.

(21) Appl. No.: 18/224,585

(22) Filed: Jul. 21, 2023

(65) Prior Publication Data

US 2023/0361773 A1 Nov. 9, 2023

Related U.S. Application Data

(63) Continuation of application No. PCT/JP2022/002655, filed on Jan. 25, 2022.

(30) Foreign Application Priority Data

Feb. 3, 2021 (JP) .................................. 2021-015945

(51) Int. Cl.
*H03K 17/691* (2006.01)
*H01F 19/04* (2006.01)
*H01F 27/32* (2006.01)
*H01L 23/495* (2006.01)
*H01L 25/16* (2023.01)
*H02M 7/537* (2006.01)

(52) U.S. Cl.
CPC .......... *H03K 17/691* (2013.01); *H01F 19/04* (2013.01); *H01F 27/32* (2013.01); *H01L 23/49506* (2013.01); *H01L 25/16* (2013.01); *H02M 7/537* (2013.01)

(58) Field of Classification Search
CPC .................................................... H03K 17/691
USPC ........................................................ 327/434
See application file for complete search history.

(56) References Cited

U.S. PATENT DOCUMENTS

| 2011/0148549 A1* | 6/2011 | Kanschat | H03H 7/00 |
| | | | 333/24 R |
| 2013/0055052 A1 | 2/2013 | Kaeriyama | |

(Continued)

FOREIGN PATENT DOCUMENTS

| JP | 2013-051547 A | 3/2013 |
| JP | 2014-522561 A | 9/2014 |

OTHER PUBLICATIONS

International Search Report and Written Opinion mailed on Mar. 8, 2022, received for PCT Application PCT/JP2022/002655, filed on Jan. 25, 2022, 9 pages including English Translation.

*Primary Examiner* — Tomi Skibinski
(74) *Attorney, Agent, or Firm* — XSENSUS LLP

(57) ABSTRACT

A gate driver configured to apply a drive voltage signal to a gate of a switching element includes a low-voltage circuit chip and a high-voltage circuit chip. The low-voltage circuit chip includes a low-voltage circuit configured to be actuated by application of a first voltage. The high-voltage circuit chip includes a high-voltage circuit configured to be actuated by application of a second voltage that is higher than the first voltage. The gate driver further includes multiple transformer chips connected in series to each other. The low-voltage circuit chip and the high-voltage circuit chip are connected by the multiple transformer chips and configured to transmit a signal through the multiple transformer chips.

15 Claims, 18 Drawing Sheets

(56) References Cited

U.S. PATENT DOCUMENTS

2013/0321094 A1\* 12/2013 Sumida .................. H01L 28/10
　　　　　　　　　　　　　　　　　　　　　　333/24.2
2014/0325322 A1　 10/2014 Kaeriyama \* cited by examiner

GATE DRIVER, INSULATION MODULE, LOW-VOLTAGE CIRCUIT UNIT, AND HIGH-VOLTAGE CIRCUIT UNIT

CROSS-REFERENCE TO RELATED APPLICATIONS

This is a continuation application of PCT Application No. PCT/JP2022/002655, filed on Jan. 25, 2022, which claims priority to Japan Patent Application No. 2021-015945, filed on Feb. 3, 2021, the entire contents of each of which are incorporated herein by reference.

BACKGROUND

1. Field

The present disclosure relates to a gate driver, an insulation module, a low-voltage circuit unit, and a high-voltage circuit unit.

2. Description of Related Art

An example of a gate driver that applies a drive voltage signal to the gate of a switching element such as a transistor is an insulated gate driver known in the art. Japanese Laid-Open Patent Publication No. 2013-51547 describes an example of a semiconductor integrated circuit used as an insulated gate driver that includes a transformer. The transformer includes a first coil at the primary side and a second coil at the secondary side.

DETAILED DESCRIPTION

Embodiments of a gate driver will be described below with reference to the drawings. The embodiments described below exemplify configurations and methods for embodying a technical concept and are not intended to limit the material, shape, structure, layout, dimensions, and the like of each component to those described below.

First Embodiment

Figure 1:
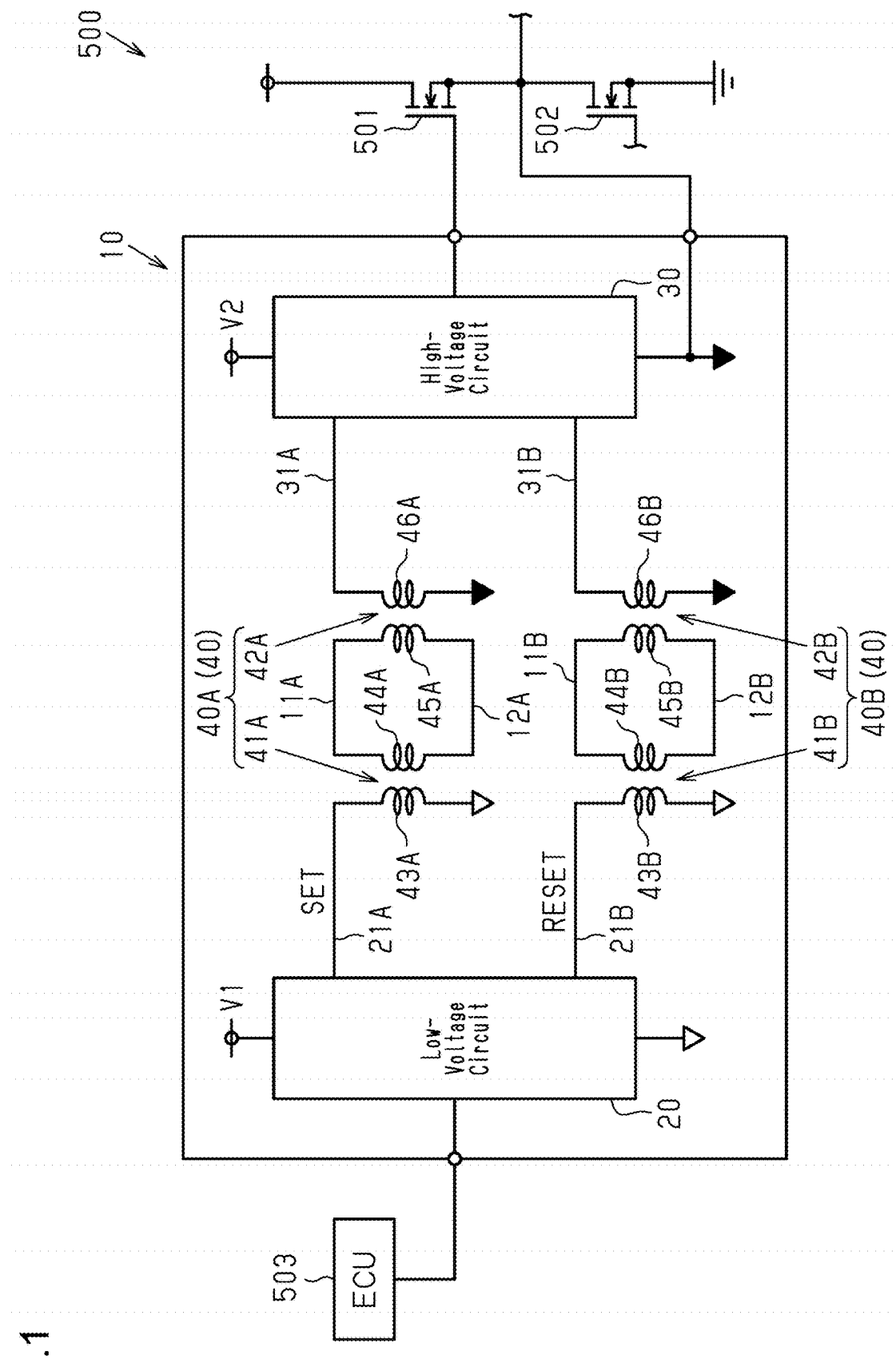
FIG. 1 is a schematic circuit diagram showing a first embodiment of a gate driver.

A first embodiment of a gate driver 10 will be described with reference to FIGS. 1 to 7. FIG. 1 schematically shows an example of a circuit configuration of the gate driver 10.

As shown in FIG. 1, the gate driver 10 is configured to apply a drive voltage signal to the gate of a switching element. In an example, the gate driver 10 is used in an inverter device 500 mounted on an electric vehicle or a hybrid electric vehicle. The inverter device 500 includes two switching elements 501 and 502 connected in series to each other, the gate driver 10, and an electronic control unit 503 (ECU) that controls the gate driver 10. In an example, the switching element 501 is a high-side switching element connected to a drive power supply. The switching element 502 is a low-side switching element. Examples of the switching elements 501 and 502 include transistors such as a Si metal-oxide-semiconductor field-effect transistor (Si MOSFET), a SiC MOSFET, and an insulated gate bipolar transistor (IGBT). The gate driver 10 of the first embodiment applies a drive voltage signal to the gate of the switching element 501. In the description hereafter, MOSFETs are used in the switching elements 501 and 502.

The gate driver 10 is provided for each of the switching elements 501 and 502 and separately drives the switching elements 501 and 502. In the first embodiment, the gate driver 10 that drives the switching element 501 will be described for the sake of convenience.

The gate driver 10 includes a low-voltage circuit 20 to which a first voltage V1 is applied, a high-voltage circuit 30 to which a second voltage V2 is applied, and transformers 40 disposed between the low-voltage circuit 20 and the high-voltage circuit 30. The second voltage V2 is higher than the first voltage V1. More specifically, the low-voltage circuit 20 and the high-voltage circuit 30 are connected by the transformers 40. The first voltage V1 and the second voltage V2 are direct current voltages.

The gate driver 10 of the first embodiment is configured, based on a control signal from the ECU 503, which is an external control device, to transmit a signal from the low-voltage circuit 20 to the high-voltage circuit 30 through the transformers 40 and to output a drive voltage signal from the high-voltage circuit 30. The control signal from the ECU 503 corresponds to an external instruction.

The signal transmitted from the low-voltage circuit 20 toward the high-voltage circuit 30, that is, a signal output from the low-voltage circuit 20, is for driving, for example, the switching element 501. Examples of the signal include a set signal and a reset signal. The set signal transmits a rising edge of the control signal from the ECU 503. The reset signal transmits a falling edge of the control signal from the ECU 503. In other words, the set signal and the reset signal are signals for generating a drive voltage signal of the switching element 501. The set signal and the reset signal correspond to a first signal.

More specifically, the low-voltage circuit 20 is actuated by application of the first voltage V1. The low-voltage circuit 20 is electrically connected to the ECU 503 and generates a set signal and a reset signal based on a control signal received from the ECU 503. In an example, the low-voltage circuit 20 generates the set signal in response to a rising edge of the control signal and generates the reset signal in response to a falling edge of the control signal. The low-voltage circuit 20 transmits the generated set signal and reset signal toward the high-voltage circuit 30.

The high-voltage circuit 30 is actuated by application of the second voltage V2. The high-voltage circuit 30 is electrically connected to the gate of the switching element 501. Based on the set signal and the reset signal received from the low-voltage circuit 20, the high-voltage circuit 30 generates a drive voltage signal for driving the switching element 501 and applies the drive voltage signal to the gate of the switching element 501. In other words, the high-voltage circuit 30 generates a drive voltage signal that is applied to the gate of the switching element 501 based on the first signal output from the low-voltage circuit 20. More specifically, the high-voltage circuit 30 generates a drive voltage signal for activating the switching element 501 based on the set signal and applies the drive voltage signal to the gate of the switching element 501. The high-voltage circuit 30 generates a drive voltage signal for deactivating the switching element 501 based on the reset signal and applies the drive voltage signal to the gate of the switching element 501. Thus, the gate driver 10 controls the activation and deactivation of the switching element 501.

The high-voltage circuit 30 includes, for example, an R-S flip-flop circuit, into which a set signal and a reset signal are input, and a driver unit. The driver unit generates a drive voltage signal based on an output signal of the R-S flip-flop circuit. However, the high-voltage circuit 30 may have any specific circuit configuration.

In the gate driver 10 of the first embodiment, the low-voltage circuit 20 and the high-voltage circuit 30 are insulated from each other by the transformers 40. More specifically, the transformers 40 restrict transmission of a direct current voltage between the low-voltage circuit 20 and the high-voltage circuit 30 while allowing transmission of various signals such as the set signal and the reset signal.

Thus, the state in which the low-voltage circuit 20 and the high-voltage circuit 30 are insulated from each other refers to a state in which transmission of a direct current voltage between the low-voltage circuit 20 and the high-voltage circuit 30 is interrupted, while transmission of a signal between the low-voltage circuit 20 and the high-voltage circuit 30 is allowed.

The insulation voltage of the gate driver 10 is, for example, greater than or equal to 2500 Vrms and less than or equal to 7500 Vrms. In the first embodiment, the insulation voltage of the gate driver 10 is approximately 5000 Vrms. However, the insulation voltage of the gate driver 10 is not limited to these values and may be any specific numerical value.

In the first embodiment, the ground of the low-voltage circuit 20 and the ground of the high-voltage circuit 30 are arranged independently. In the description hereafter, the ground potential of the low-voltage circuit 20 is referred to as a first reference potential, and the ground potential of the high-voltage circuit 30 is referred to as a second reference potential. In this case, the first voltage V1 is a voltage from the first reference potential, and the second voltage V2 is a voltage from the second reference potential. The first voltage V1 is, for example, greater than or equal to 4.5 V and less than or equal to 5.5 V. The second voltage V2 is, for example, greater than or equal to 9 V and less than or equal to 24 V.

The transformers 40 will now be described in detail.

The gate driver 10 of the first embodiment includes two transformers 40 corresponding to two types of signals transmitted from the low-voltage circuit 20 to the high-voltage circuit 30. More specifically, the gate driver 10 includes a transformer 40 that is used to transmit a set signal and a transformer 40 that is used to transmit a reset signal. Hereinafter, for the sake of brevity, the transformer 40 used to transmit a set signal is referred to as a transformer 40A. The transformer 40 used to transmit a reset signal is referred to as a transformer 40B.

The gate driver 10 includes a low-voltage signal line 21A, which connects the low-voltage circuit 20 and the transformer 40A, and a low-voltage signal line 21B, which connects the low-voltage circuit 20 and the transformer 40B. Thus, the low-voltage signal line 21A transmits the set signal from the low-voltage circuit 20 to the transformer 40A. The low-voltage signal line 21B transmits the reset signal from the low-voltage circuit 20 to the transformer 40B.

The gate driver 10 includes a high-voltage signal line 31A, which connects the transformer 40A and the high-voltage circuit 30, and a high-voltage signal line 31B, which connects the transformer 40B and the high-voltage circuit 30. Thus, the high-voltage signal line 31A transmits the set signal from the transformer 40A to the high-voltage circuit 30. The high-voltage signal line 31B transmits the reset signal from the transformer 40B to the high-voltage circuit 30.

The transformer 40A electrically insulates the low-voltage circuit 20 from the high-voltage circuit 30 while transmitting the set signal from the low-voltage circuit 20 to the high-voltage circuit 30. The transformer 40A includes a first transformer 41A and a second transformer 42A connected in series to each other.

The gate driver 10 includes two connection signal lines 11A and 12A that connect the first transformer 41A and the second transformer 42A. Thus, the set signal transmits through the two connection signal lines 11A and 12A.

In the first embodiment, the insulation voltage of each of the transformers 41A and 42A is, for example, greater than or equal to 2500 Vrms and less than or equal to 7500 Vrms. The insulation voltage of each of the transformers 41A and 42A may be greater than or equal to 2500 Vrms and less than or equal to 5700 Vrms. In the first embodiment, the insulation voltages of the transformers 41A and 42A are equal to each other. However, the insulation voltages of the transformers 41A and 42A are not limited to these values and may be any value.

The first transformer 41A includes a first coil 43A and a second coil 44A that is electrically insulated from and configured to be magnetically coupled to the first coil 43A. The second transformer 42A includes a first coil 45A and a second coil 46A that is electrically insulated from and configured to be magnetically coupled to the first coil 45A.

The first coil 43A is connected to the low-voltage circuit 20 by the low-voltage signal line 21A and is also connected to the ground of the low-voltage circuit 20. More specifically, the first coil 43A includes a first end electrically connected to the low-voltage circuit 20 and a second end electrically connected to the ground of the low-voltage circuit 20. Thus, the potential of the second end of the first coil 43A equals the first reference potential. The first reference potential is, for example, 0 V.

The second coil 44A is connected to the first coil 45A. In an example, the second coil 44A and the first coil 45A are connected to each other so as to be electrically floating. More specifically, the connection signal line 11A connects a first end of the second coil 44A and a first end of the first coil 45A. The connection signal line 12A connects a second end of the second coil 44A and a second end of the first coil 45A. Thus, the second coil 44A and the first coil 45A serve as relay coils that relay transmission of a signal between the first coil 43A and the second coil 46A.

The second coil 46A is connected to the high-voltage circuit 30 by the high-voltage signal line 31A and is also connected to the ground of the high-voltage circuit 30. More specifically, the second coil 46A includes a first end electrically connected to the high-voltage circuit 30 and a second end electrically connected to the ground of the high-voltage circuit 30. Thus, the potential of the second end of the second coil 46A equals the second reference potential. The ground of the high-voltage circuit 30 is connected to the source of the switching element 501. Thus, the second reference potential fluctuates as the inverter device 500 is driven and may become, for example, greater than or equal to 600 V.

The transformer 40B electrically insulates the low-voltage circuit 20 from the high-voltage circuit 30 while transmitting the reset signal from the low-voltage circuit 20 to the high-voltage circuit 30. The transformer 40B includes a first transformer 41B and a second transformer 42B connected in series to each other.

The gate driver 10 includes two connection signal lines 11B and 12B that connect the first transformer 41B and the second transformer 42B. Thus, the reset signal transmits through the two connection signal lines 11B and 12B.

The first transformer 41B includes a first coil 43B and a second coil 44B that is electrically insulated from and configured to be magnetically coupled to the first coil 43B. The second transformer 42B includes a first coil 45B and a second coil 46B that is electrically insulated from and configured to be magnetically coupled to the first coil 45B. The insulation voltage of the first transformer 41B is equal to the insulation voltage of the first transformer 41A. The insulation voltage of the second transformer 42B is the same as the insulation voltage of the second transformer 42A. The connection configuration of the first transformer 41B and the second transformer 42B is the same as the connection configuration of the first transformer 41A and the second transformer 42A and thus will not be described in detail.

The set signal output from the low-voltage circuit 20 is transmitted through the first transformer 41A and the second transformer 42A to the high-voltage circuit 30. The reset signal output from the low-voltage circuit 20 is transmitted through the first transformer 41B and the second transformer 42B to the high-voltage circuit 30.

Figure 2:
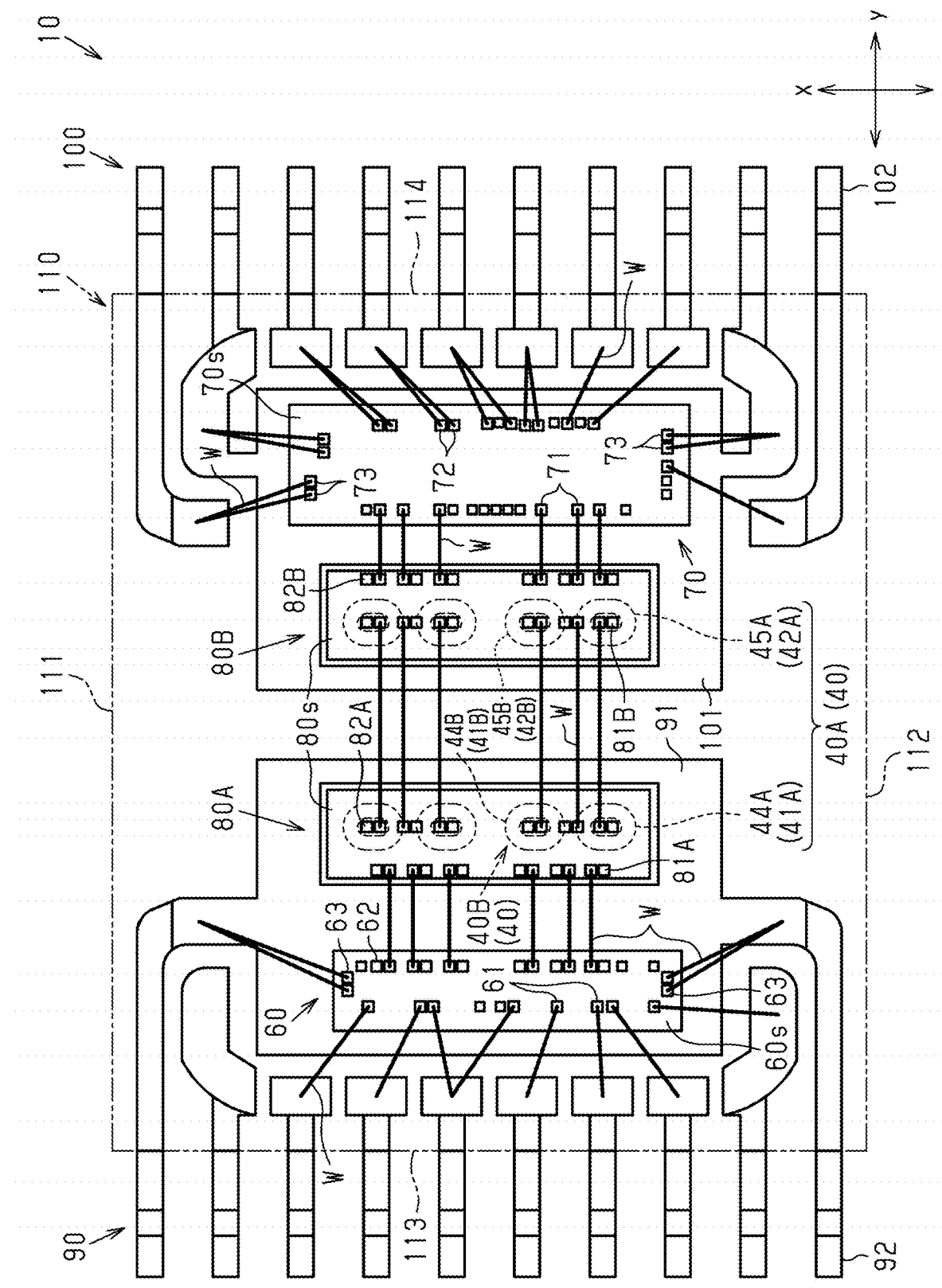
FIG. 2 is a plan view showing an internal structure of the gate driver of the first embodiment.

FIG. 2 shows an example of a plan view showing the internal structure of the gate driver 10. FIG. 1 shows a simplified circuit configuration of the gate driver 10. Hence, the number of external terminals of the gate driver 10 shown in FIG. 2 is greater than the number of external terminals of the gate driver 10 shown in FIG. 1. The number of external terminals of the gate driver 10 is the number of external electrodes configured to connect the gate driver 10 to electronic components arranged outside the gate driver 10, such as the ECU 503 or the switching element 501 (refer to FIG. 1). The number of signal lines (the number of wires W described later) that transmit a signal from the low-voltage circuit 20 to the high-voltage circuit 30 in the gate driver 10 shown in FIG. 2 is greater than the number of signal lines in the gate driver 10 shown in FIG. 1.

As shown in FIG. 2, the gate driver 10 is a semiconductor device including multiple semiconductor chips arranged in a single package and is, for example, mounted on a circuit substrate disposed in the inverter device 500. Each of the switching elements 501 and 502 is mounted on a mount substrate that differs from the circuit substrate. A cooling unit is attached to the mount substrate.

The package type of the gate driver 10 is small outline (SO) and is a small outline package (SOP) in the first embodiment. The gate driver 10 includes a low-voltage circuit chip 60, a high-voltage circuit chip 70, a first transformer chip 80A, and a second transformer chip 80B, which are semiconductor chips. The gate driver 10 further includes a low-voltage lead frame 90 on which the low-voltage circuit chip 60 is mounted, a high-voltage lead frame 100 on which the high-voltage circuit chip 70 is mounted, and an encapsulation resin 110 that encapsulates the chips 60, 70, 80A, and 80B and a part of each of the lead frames 90 and 100. In the first embodiment, the first transformer chip 80A and the second transformer chip 80B correspond to "multiple transformer chips" that insulate the low-voltage circuit 20 from the high-voltage circuit 30. In FIG. 2, the encapsulation resin 110 is indicated by double-dashed lines to illustrate the internal structure of the gate driver 10. The package type of the gate driver 10 may be changed in any manner.

The encapsulation resin 110 is formed from an electrically-insulative material and is formed from, for example, a black epoxy resin. The encapsulation resin 110 has the form of a rectangular plate having a thickness-wise direction conforming to the z-direction. The encapsulation resin 110 includes four resin side surfaces 111 to 114. More specifically, the encapsulation resin 110 includes two end surfaces in the x-direction, namely, the resin side surfaces 111 and 112, and two end surfaces in the y-direction, namely, the resin side surfaces 113 and 114. The x-direction and the y-direction are orthogonal to the z-direction. The x-direction and the y-direction are orthogonal to each other. In the description hereafter, a plan view means a view from the z-direction.

The low-voltage lead frame 90 and the high-voltage lead frame 100 are formed from a conductor and, in the first embodiment, are formed from copper (Cu). The lead frames 90 and 100 are disposed to extend from the inside to the outside of the encapsulation resin 110.

The low-voltage lead frame 90 includes a low-voltage die pad 91 disposed in the encapsulation resin 110 and low-voltage leads 92 disposed to extend from the inside to the outside of the encapsulation resin 110. Each low-voltage lead 92 includes an external terminal configured to be electrically connected to an external electronic device such as the ECU 503 (refer to FIG. 1).

The low-voltage circuit chip 60 and the first transformer chip 80A are mounted on the low-voltage die pad 91. In plan view, the low-voltage die pad 91 is disposed so that the center of the low-voltage die pad 91 in the y-direction is located closer in the y-direction to the resin side surface 113 than the center of the encapsulation resin 110 is. In the first embodiment, the low-voltage die pad 91 is not exposed from the encapsulation resin 110. In plan view, the low-voltage die pad 91 is rectangular so that the long sides extend in the x-direction and the short sides extend in the y-direction.

The low-voltage leads 92 are spaced apart from each other in the x-direction. Among the low-voltage leads 92, the low-voltage leads 92 located at opposite ends in the x-direction are integrated with the low-voltage die pad 91. Each low-voltage lead 92 partially projects from the resin side surface 113 toward the outside of the encapsulation resin 110.

The high-voltage lead frame 100 includes a high-voltage die pad 101 disposed in the encapsulation resin 110 and high-voltage leads 102 disposed to extend from the inside to the outside of the encapsulation resin 110. Each high-voltage lead 102 includes an external terminal configured to be electrically connected to an external electronic device such as the gate of the switching element 501 (refer to FIG. 1).

The high-voltage circuit chip 70 and the second transformer chip 80B are mounted on the high-voltage die pad 101. In plan view, the high-voltage die pad 101 is disposed closer in the y-direction to the resin side surface 114 than the low-voltage die pad 91 is. In the first embodiment, the high-voltage die pad 101 is not exposed from the encapsulation resin 110. In plan view, the high-voltage die pad 101 is rectangular so that the long sides extend in the x-direction and the short sides extend in the y-direction.

The low-voltage die pad 91 and the high-voltage die pad 101 are spaced apart from each other in the y-direction. The y-direction may also be referred to as the arrangement direction of the two die pads 91 and 101.

The dimensions of the low-voltage die pad 91 and the high-voltage die pad 101 in the y-direction are set in accordance with the size and the number of semiconductor chips that are mounted. In the first embodiment, the low-voltage circuit chip 60 and the first transformer chip 80A are mounted on the low-voltage die pad 91, and the high-voltage circuit chip 70 and the second transformer chip 80B are mounted on the high-voltage die pad 101. Therefore, the dimension of the low-voltage die pad 91 in the y-direction is substantially equal to the dimension of the high-voltage die pad 101 in the y-direction.

The high-voltage leads 102 are spaced apart from each other in the x-direction. Among the high-voltage leads 102, two of the high-voltage leads 102 are integrated with the high-voltage die pad 101. Each high-voltage lead 102 partially projects from the resin side surface 114 toward the outside of the encapsulation resin 110.

In the first embodiment, the number of the high-voltage leads 102 is the same as the number of the low-voltage leads 92. As shown in FIG. 2, the low-voltage leads 92 and the high-voltage leads 102 are arranged in a direction (x-direction) orthogonal to the arrangement direction (y-direction) of the low-voltage die pad 91 and the high-voltage die pad 101. The number of the high-voltage leads 102 and the number of the low-voltage leads 92 may be changed in any manner.

In the first embodiment, the low-voltage die pad 91 is supported by the two low-voltage leads 92 integrated with the low-voltage die pad 91, and the high-voltage die pad 101 is supported by the two high-voltage leads 102 integrated with the high-voltage die pad 101. Thus, the die pads 91 and 101 do not include suspension leads exposed from the resin side surfaces 111 and 112. This increases the insulation distance between the low-voltage lead frame 90 and the high-voltage lead frame 100.

The low-voltage circuit chip 60, the high-voltage circuit chip 70, the first transformer chip 80A, and the second transformer chip 80B are spaced apart from each other in the y-direction. In the first embodiment, the low-voltage circuit chip 60, the first transformer chip 80A, the second transformer chip 80B, and the high-voltage circuit chip 70 are arranged in this order from the low-voltage leads 92 toward the high-voltage leads 102 in the y-direction.

Figure 3:
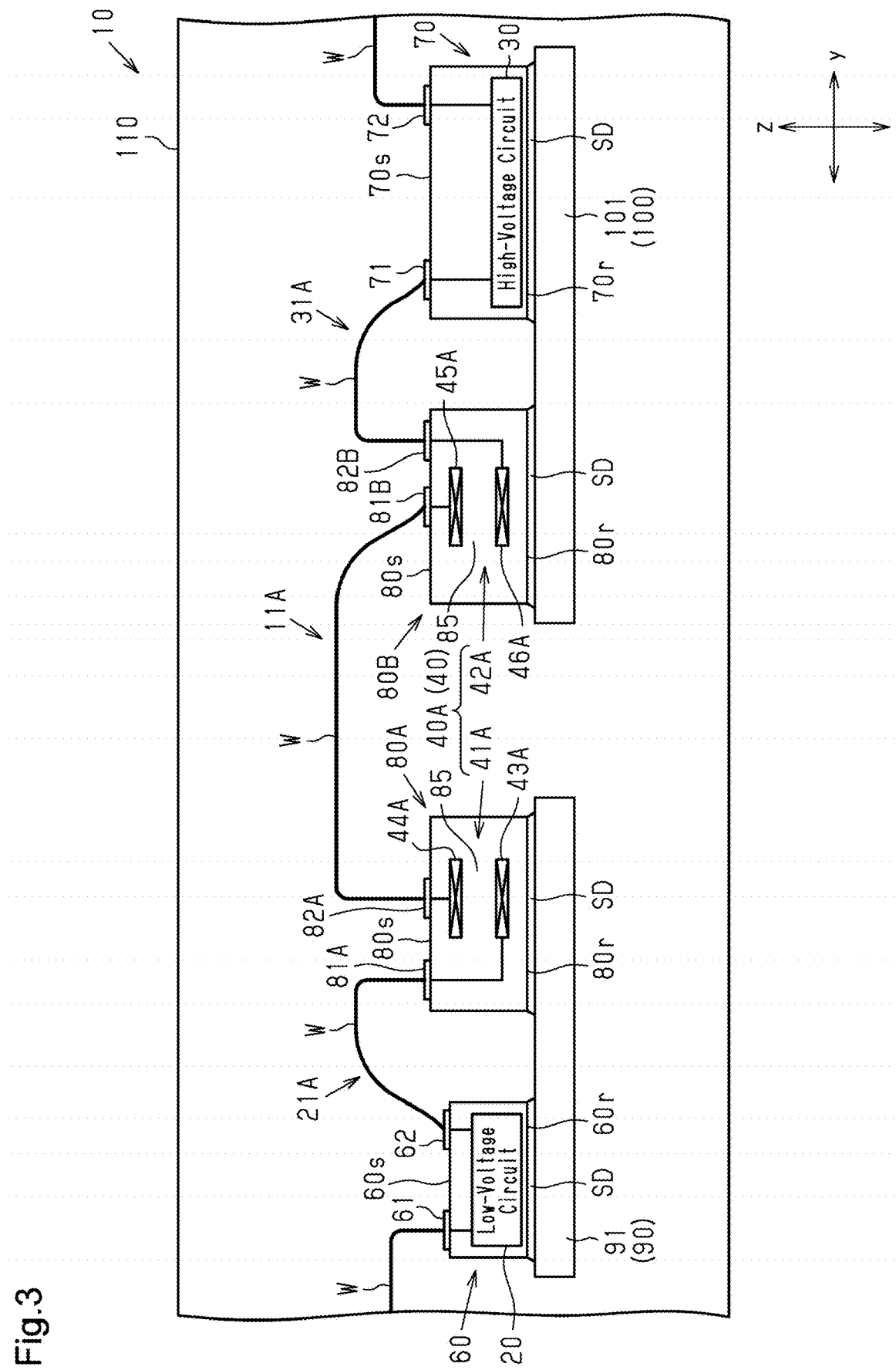
FIG. 3 is a schematic cross-sectional view of a portion of the gate driver shown in FIG. 2.

The low-voltage circuit chip 60 includes the low-voltage circuit 20 shown in FIG. 1. In plan view, the low-voltage circuit chip 60 is rectangular and has short sides and long sides. In plan view, the low-voltage circuit chip 60 is mounted on the low-voltage die pad 91 such that the long sides extend in the x-direction and the short sides extend in the y-direction. As shown in FIG. 3, the low-voltage circuit chip 60 includes a chip main surface 60s and a chip back surface 60r facing opposite directions in the z-direction. The chip back surface 60r of the low-voltage circuit chip 60 is bonded to the low-voltage die pad 91 by a conductive bonding material SD such as solder or silver (Ag) paste.

As shown in FIG. 2, first electrode pads 61, second electrode pads 62, and third electrode pads 63 are formed on the chip main surface 60s of the low-voltage circuit chip 60. The electrode pads 61 to 63 are electrically connected to the low-voltage circuit 20.

The first electrode pads 61 are located on the chip main surface 60s between the center of the chip main surface 60s in the y-direction and the low-voltage leads 92. The first electrode pads 61 are arranged in the x-direction. The second electrode pads 62 are disposed on one of the opposite ends of the chip main surface 60s in the y-direction located closer to the first transformer chip 80A. The second electrode pads 62 are arranged in the x-direction. The third electrode pads 63 are disposed on opposite ends of the chip main surface 60s in the x-direction.

The high-voltage circuit chip 70 includes the high-voltage circuit 30 shown in FIG. 1. In plan view, the high-voltage circuit chip 70 is rectangular and has short sides and long sides. In plan view, the high-voltage circuit chip 70 is mounted on the high-voltage die pad 101 such that the long sides extend in the x-direction and the short sides extend in the y-direction. As shown in FIG. 3, the high-voltage circuit chip 70 includes a chip main surface 70s and a chip back surface 70r facing opposite directions in the z-direction. The chip back surface 70r of the high-voltage circuit chip 70 is bonded to the high-voltage die pad 101 by the conductive bonding material SD.

As shown in FIG. 2, first electrode pads 71, second electrode pads 72, and third electrode pads 73 are formed on the chip main surface 70s of the high-voltage circuit chip 70. The electrode pads 71 to 73 are electrically connected to the high-voltage circuit 30.

The first electrode pads 71 are disposed on one of the opposite ends of the chip main surface 70s in the y-direction located closer to the second transformer chip 80B. The first electrode pads 71 are arranged in the x-direction. The second electrode pads 72 are disposed on one of the opposite ends of the chip main surface 70s in the y-direction located farther away from the second transformer chip 80B. The second electrode pads 72 are arranged in the x-direction. The third electrode pads 73 are disposed on opposite ends of the chip main surface 70s in the x-direction.

The first transformer chip 80A includes the first transformers 41A and 41B. The first transformer chip 80A does not include the low-voltage circuit 20 and the high-voltage circuit 30 and is dedicated to the first transformers 41A and 41B. In plan view, the first transformer chip 80A is rectangular and has short sides and long sides. In the first embodiment, in plan view, the first transformer chip 80A is mounted on the low-voltage die pad 91 such that the long sides extend in the x-direction and the short sides extend in the y-direction.

The first transformer chip 80A is disposed adjacent to the low-voltage circuit chip 60 in the y-direction. The first transformer chip 80A is located closer to the second transformer chip 80B than the low-voltage circuit chip 60 is. In other words, the first transformer chip 80A is disposed between the low-voltage circuit chip 60 and the second transformer chip 80B in the y-direction.

As shown in FIG. 3, the first transformer chip 80A includes a chip main surface 80s and a chip back surface 80r facing opposite directions in the z-direction. The chip back surface 80r of the first transformer chip 80A is bonded to the low-voltage die pad 91 by the conductive bonding material SD.

As shown in FIG. 2, first electrode pads 81A and second electrode pads 82A are formed on the chip main surface 80s of the first transformer chip 80A. The first electrode pads 81A are disposed, for example, on one of the opposite ends of the chip main surface 80s in the y-direction located closer to the low-voltage circuit chip 60. The first electrode pads 81A are arranged in the x-direction. The second electrode pads 82A are disposed at the center of the chip main surface 80s in the y-direction. The second electrode pads 82A are arranged in the x-direction.

The second transformer chip 80B includes second transformers 42A and 42B. The second transformer chip 80B does not include the low-voltage circuit 20 and the high-voltage circuit 30 and is dedicated to the second transformers 42A and 42B. The shape and size of the second transformer chip 80B are the same as those of the first transformer chip 80A. In plan view, the second transformer chip 80B is mounted on the high-voltage die pad 101 such that the long sides extend in the x-direction and the short sides extend in the y-direction.

The second transformer chip 80B is disposed adjacent to the high-voltage circuit chip 70 in the y-direction. The second transformer chip 80B is located closer to the first transformer chip 80A than the high-voltage circuit chip 70 is. In other words, the second transformer chip 80B is disposed between the first transformer chip 80A and the high-voltage circuit chip 70 in the y-direction. As shown in FIG. 3, in the same manner as the first transformer chip 80A, the second transformer chip 80B includes a chip main surface 80s and a chip back surface 80r. The chip back surface 80r is bonded to the high-voltage die pad 101 by the conductive bonding material SD.

As shown in FIG. 2, first electrode pads 81B and second electrode pads 82B are formed on the chip main surface 80s of the second transformer chip 80B. The second electrode pads 81B are disposed at the center of the chip main surface 80s in the y-direction. The first electrode pads 81B are arranged in the x-direction. The second electrode pads 82B are disposed, for example, on one of the opposite ends of the chip main surface 80s in the y-direction located closer to the high-voltage circuit chip 70. The second electrode pads 82B are arranged in the x-direction.

The lead frames 90 and 100 are located closest to each other at the low-voltage die pad 91 and the high-voltage die pad 101. Therefore, the low-voltage die pad 91 and the high-voltage die pad 101 need to be separated from each other so that the insulation voltage of the gate driver 10 is set to a predetermined insulation voltage. Therefore, in plan view, the first transformer chip 80A and the second transformer chip 80B are separated from each other by a distance that is greater than each of the distance between the low-voltage circuit chip 60 and the first transformer chip 80A and the distance between the high-voltage circuit chip 70 and the second transformer chip 80B.

Wires W are connected to each of the low-voltage circuit chip 60, the first transformer chip 80A, the second transformer chip 80B, and the high-voltage circuit chip 70. Each of the wires W is a bonding wire formed by a wire bonder and is, for example, formed from a conductor such as gold (Au), aluminum (Al), or Cu.

The low-voltage circuit chip 60 is electrically connected to the low-voltage lead frame 90 by wires W. More specifically, the first electrode pads 61 of the low-voltage circuit chip 60 are connected to the low-voltage leads 92 by the wires W. The third electrode pads 63 of the low-voltage circuit chip 60 are connected by wires W to the two low-voltage leads 92 integrated with the low-voltage die pad 91. Thus, the low-voltage circuit 20 is electrically connected to the low-voltage leads 92 (external electrodes of the gate driver 10 that are electrically connected to the ECU 503). In the first embodiment, the two low-voltage leads 92 integrated with the low-voltage die pad 91 include a ground terminal, and the wires W electrically connect the low-voltage circuit 20 to the low-voltage die pad 91. Thus, the low-voltage die pad 91 has the same potential as the ground of the low-voltage circuit 20.

The high-voltage circuit chip 70 and the high-voltage leads 102 of the high-voltage lead frame 100 are electrically connected by wires W. More specifically, the second electrode pads 72 and the third electrode pads 73 of the high-voltage circuit chip 70 are connected to the high-voltage leads 102 by the wires W. Thus, the high-voltage circuit 30 is electrically connected to the high-voltage leads 102 (external electrodes of the gate driver 10 that are electrically connected to the inverter device 500 such as the switching element 501). In the first embodiment, the two high-voltage leads 102 integrated with the high-voltage die pad 101 include a ground terminal, and the wires W electrically connect the high-voltage circuit 30 and the high-voltage die pad 101. Thus, the high-voltage die pad 101 has the same potential as the ground of the high-voltage circuit 30.

The first transformer chip 80A is connected to the low-voltage circuit chip 60 by wires W. More specifically, the first electrode pads 81A of the first transformer chip 80A are connected to the second electrode pads 62 of the low-voltage circuit chip 60 by the wires W.

The second transformer chip 80B is connected to the high-voltage circuit chip 70 by wires W. More specifically, the second electrode pads 82B of the second transformer chip 80B and the second electrode pads 72 of the high-voltage circuit chip 70 are connected by the wires W.

The first transformer chip 80A and the second transformer chip 80B are connected by wires W. More specifically, the second electrode pads 82A of the first transformer chip 80A and the first electrode pads 81B of the second transformer chip 80B are connected by the wires W.

Each of the first coil 43A of the transformer 40A and the first coil 43B of the transformer 40B (refer to FIG. 1) is electrically connected to the ground of the low-voltage circuit 20 through the wires W, the low-voltage circuit chip 60, and the like. Each of the second coil 46A of the transformer 40A and the second coil 46B of the transformer 40B (refer to FIG. 1) is electrically connected to the ground of the high-voltage circuit 30 through the wires W, the high-voltage circuit chip 70, and the like.

Figure 4:
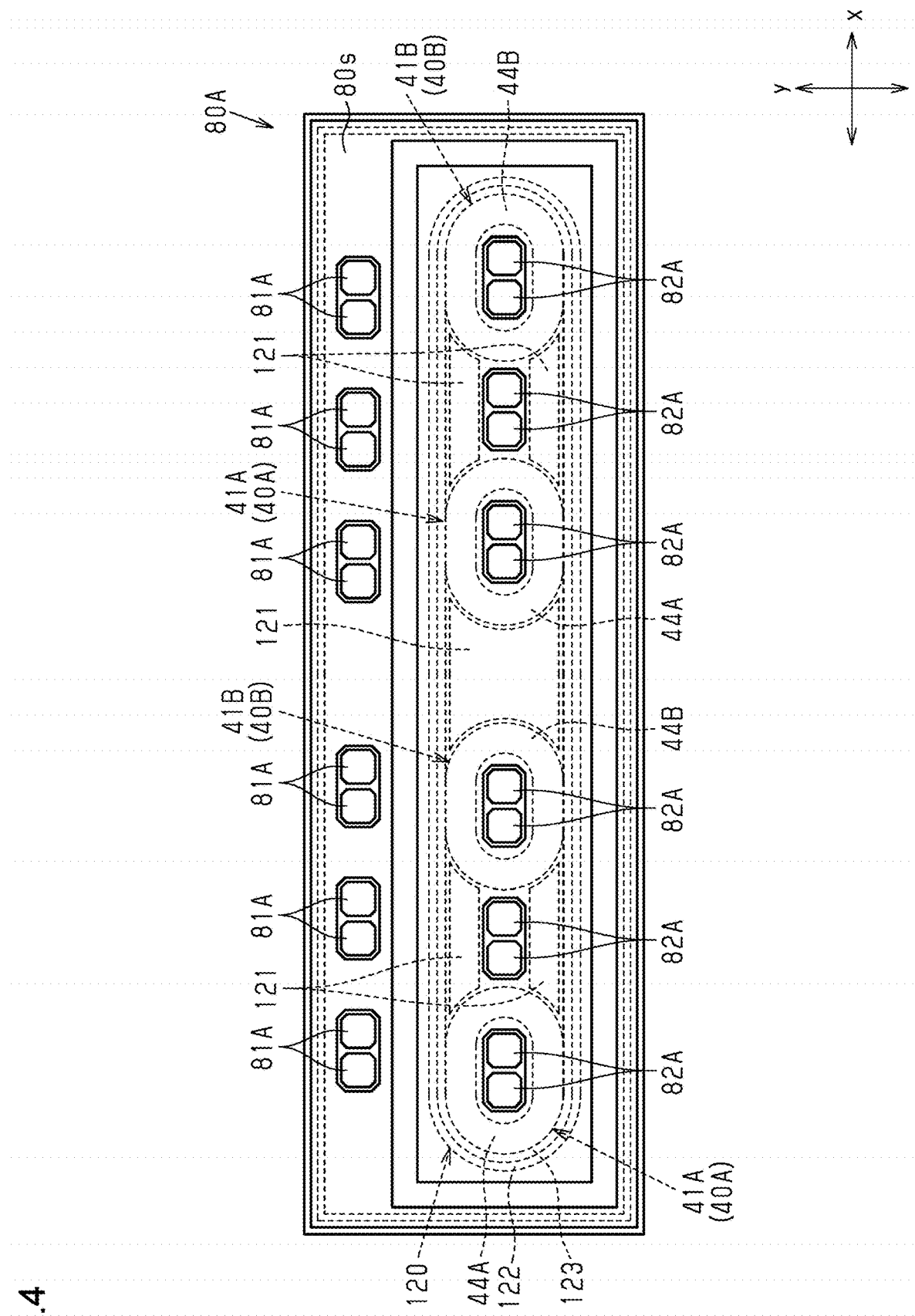
FIG. 4 is a plan view of a first transformer chip in the gate driver shown in FIG. 2.
Figure 5:
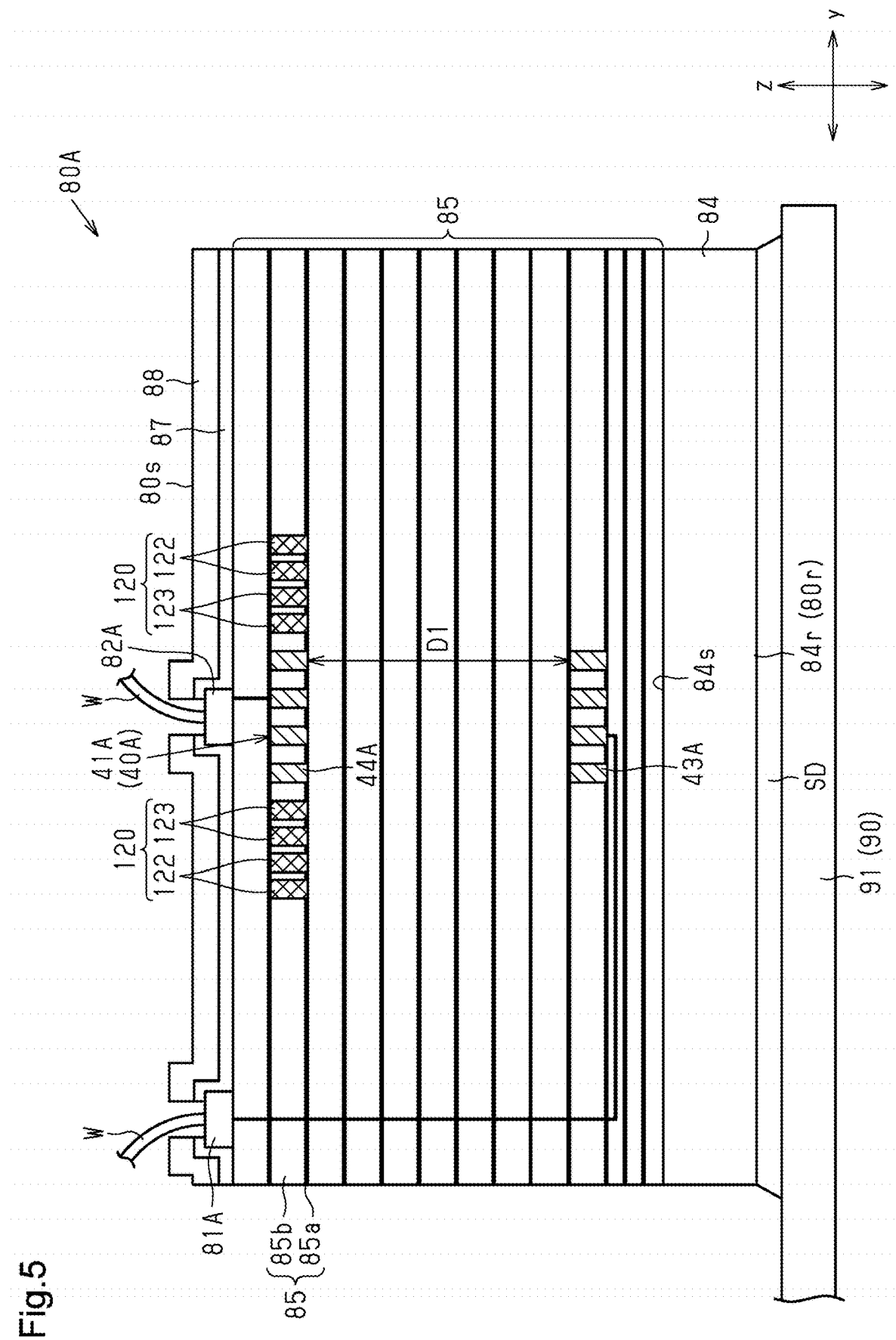
FIG. 5 is a schematic cross-sectional view of the first transformer chip shown in FIG. 4.
Figure 6:
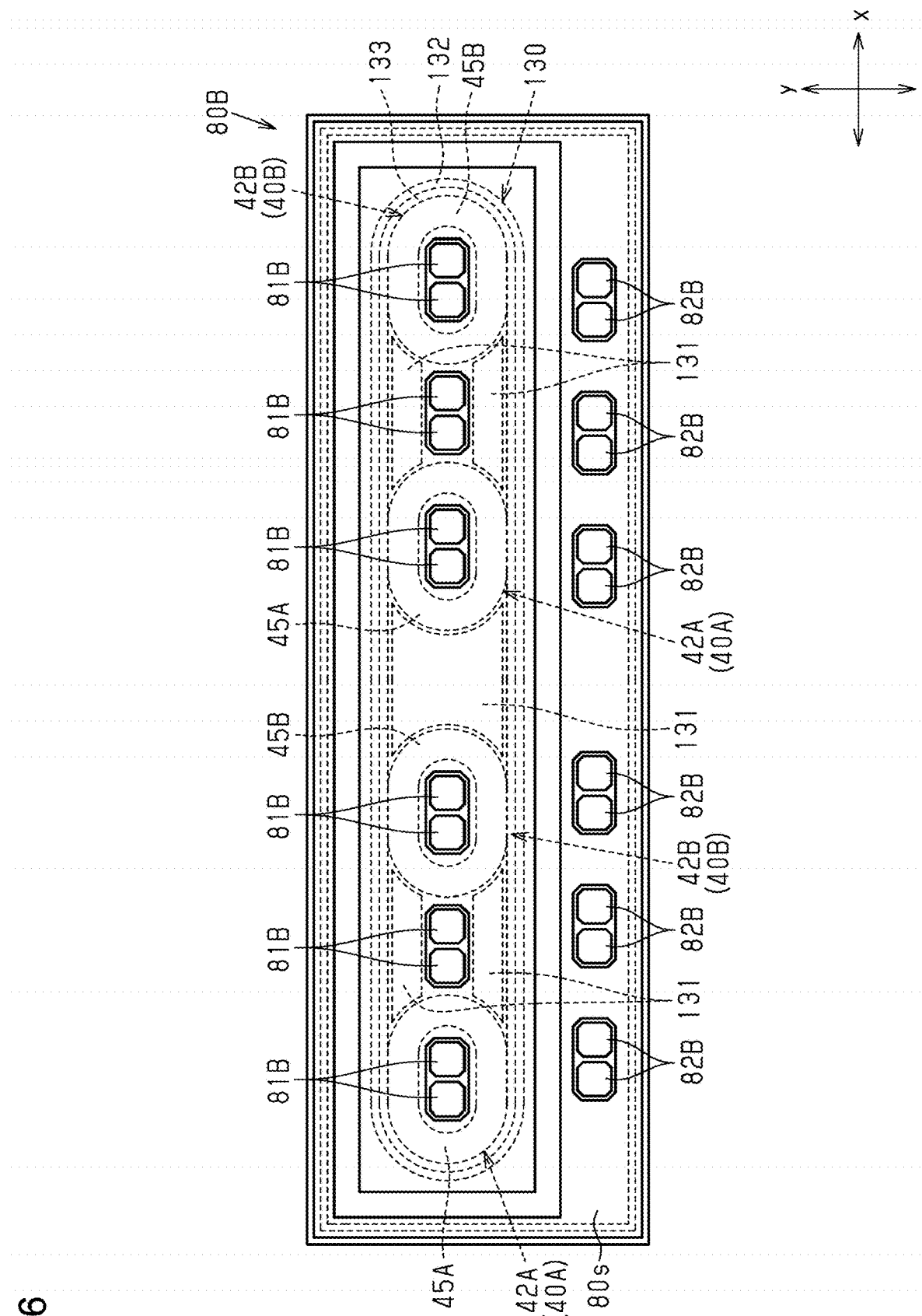
FIG. 6 is a plan view of a second transformer chip in the gate driver shown in FIG. 2.
Figure 7:
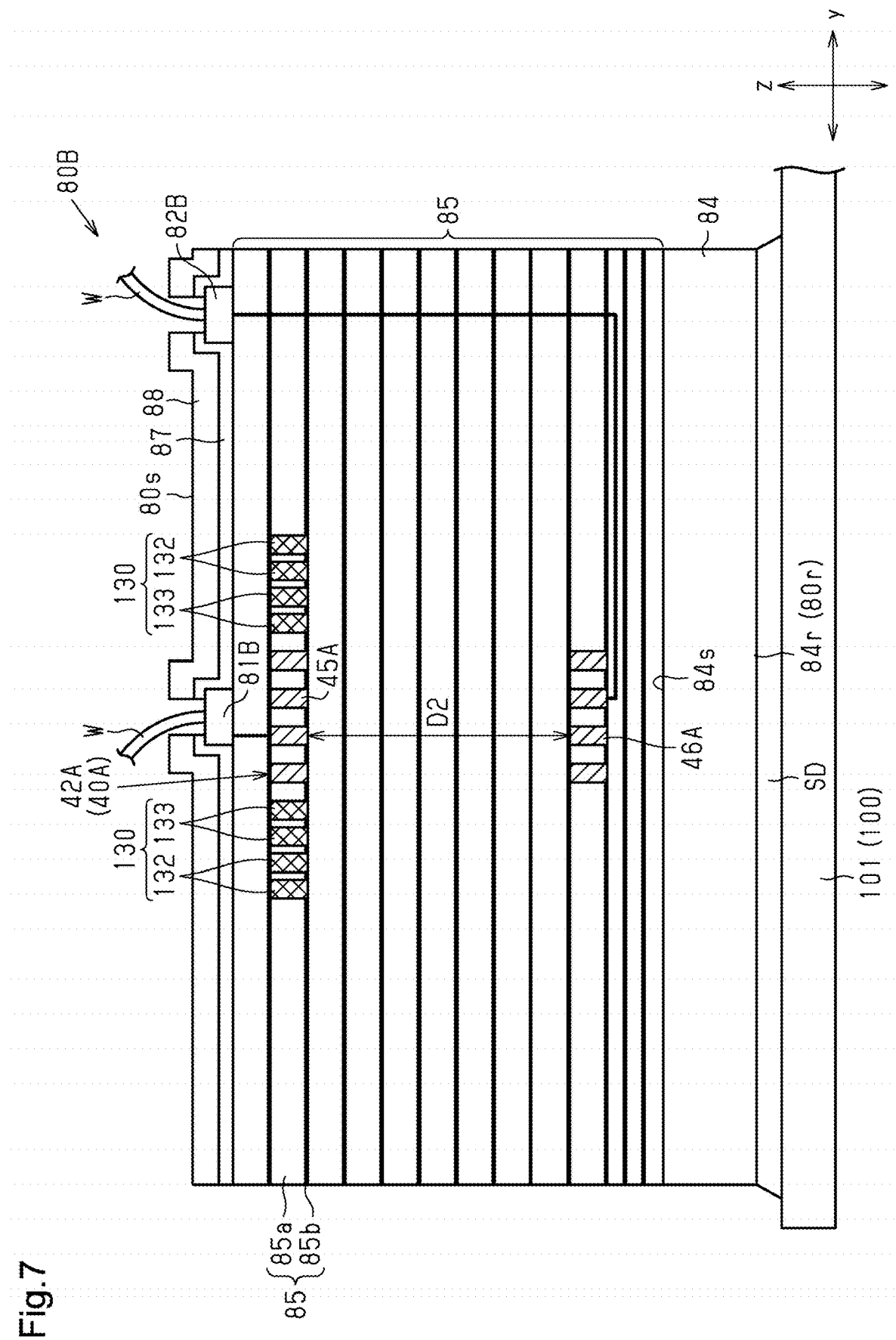
FIG. 7 is a schematic cross-sectional view of the second transformer chip shown in FIG. 6.

The structure of the first transformer chip 80A will be described in detail with reference to FIGS. 4 to 7. FIG. 4 is a plan view of the first transformer chip 80A in which the first transformers 41A and 41B are indicated by broken lines. FIG. 5 is a cross-sectional view of the first transformer chip 80A showing the first transformer 41A. FIG. 6 is a plan view of the second transformer chip 80B in which the second transformers 42A and 42B are indicated by broken lines. FIG. 7 is a cross-sectional view of the second transformer chip 80B showing the second transformer 42A. In the following description, a direction from the chip back surface 80r toward the chip main surface 80s is referred to as an upward direction, and a direction from the chip main surface 80s toward the chip back surface 80r is referred to as a downward direction.

As shown in FIG. 4, multiple (in the first embodiment, two) first transformers 41A and multiple (in the first embodiment, two) first transformers 41B are alternately arranged in the x-direction. The multiple first transformers 41A and 41B are aligned with each other in the y-direction and spaced apart from each other in the x-direction. The number of the first transformers 41A and 41B may be changed in any manner.

The first transformers 41A and 41B are located closer to the second transformer chip 80B (refer to FIG. 2) than the first electrode pads 81A are. Each of the second coils 44A and 44B of the first transformers 41A and 41B is formed to surround the second electrode pads 82A in plan view.

A dummy pattern 120 is arranged around the second coils 44A and 44B of the first transformers 41A and 41B. More specifically, the dummy pattern 120 is arranged around coils of the first transformers 41A and 41B located closer to the chip main surface 80s of the first transformer chip 80A. The dummy pattern 120 includes a first dummy pattern 121, a second dummy pattern 122, and a third dummy pattern 123. Each of the dummy patterns 121 to 123 may include at least one of titanium (Ti), titanium nitride (TiN), Au, Ag, Cu, Al, and tungsten (W).

The first dummy pattern 121 is formed around each of the second coils 44A and 44B of the first transformers 41A and 41B as viewed in the z-direction. In the illustrated example, the first dummy pattern 121 is formed in a region between the second coils 44A and 44B located adjacent to each other in the x-direction.

The first dummy pattern 121 is electrically connected to at least one of the second coils 44A and 44B. Thus, the first dummy pattern 121 has the same potential as the second coils 44A and 44B. Therefore, as the second reference potential of the second coil 44B changes, the voltage of the first dummy pattern 121 may become higher than that of the first coil 43B in the same manner as the second coil 44B. Although not illustrated, the pattern shape of the first dummy pattern 121 differs from the pattern shape of the second coils 44A and 44B.

The third dummy pattern 123 is formed to surround the two second coils 44A and the two second coils 44B as viewed in the z-direction. The third dummy pattern 123 is electrically connected to the first dummy pattern 121. Thus, in the third dummy pattern 123, similar to the first dummy pattern 121, as the second reference potential of the second coil 44B changes, the voltage of the third dummy pattern 123 may become higher than that of the first coil 43B.

The second dummy pattern 122 is formed to surround the third dummy pattern 123 as viewed in the z-direction. The second dummy pattern 122 is formed to be electrically floating.

As shown in FIG. 5, the first transformer chip 80A includes a substrate 84 and an insulation layers 85 formed on the substrate 84.

The substrate 84 is formed of, for example, a semiconductor substrate. In the first embodiment, the substrate 84 is formed from a material containing silicon (Si). As the semiconductor substrate, a wide-bandgap semiconductor or a compound semiconductor may be used for the substrate 84. Alternatively, instead of the semiconductor substrate, an insulating substrate formed from a glass-containing material may be used for the substrate 84.

The wide-bandgap semiconductor is a semiconductor substrate having a band gap that is greater than or equal to 2.0 eV. The wide-bandgap semiconductor may be silicon carbide (SiC). The compound semiconductor may be a group III-V compound semiconductor. The compound semiconductor may include at least one of aluminum nitride (AlN), indium nitride (InN), gallium nitride (GaN), and gallium arsenide (GaAs).

The substrate 84 includes a substrate main surface 84s and a substrate back surface 84r facing opposite directions in the z-direction. The substrate back surface 84r defines the chip back surface 80r of the first transformer chip 80A.

In the first embodiment, insulation layers 85 are stacked on the substrate main surface 84s of the substrate 84 in the z-direction. Thus, the z-direction may be referred to as a thickness-wise direction of the insulation layers 85. The insulation layers 85 are formed on the substrate main surface 84s of the substrate 84. In the first embodiment, the total thickness of the insulation layers 85 is greater than the thickness of the substrate 84. The number of the insulation layers 85 stacked is set in accordance with an insulation voltage required of the first transformer chip 80A. Therefore, depending on the number of the insulation layers 85 stacked, the total thickness of the insulation layers 85 may be smaller than the thickness of the substrate 84.

The insulation layers 85 include a first insulation layer 85a and a second insulation layer 85b formed on the first insulation layer 85a.

The first insulation layer 85a is, for example, an etching stopper layer, and is formed from silicon nitride (SiN), SiC, nitrogen-added silicon carbide (SiCN), or the like. In the present embodiment, the first insulation layer 85a is formed from SiN. The second insulation layer 85b is, for example, an interlayer insulation layer and is formed from silicon oxide ($SiO_2$). As shown in FIG. 5, the second insulation layer 85b of the insulation layer 85 is greater in thickness than the first insulation layer 85a. The first insulation layer 85a may be greater than or equal to 100 nm and less than 1000 nm. The second insulation layer 85b may be greater than or equal to 1000 nm and less than or equal to 3000 nm. In the first embodiment, the thickness of the first insulation layer 85a is, for example, approximately 300 nm, and the thickness of the second insulation layer 85b is, for example, approximately 2000 nm.

The first transformers 41A and 41B are embedded in the insulation layers 85. As shown in FIG. 5, the first coil 43A and the second coil 44A of the first transformer 41A are opposed to each other in the z-direction with the insulation layers 85 interposed therebetween. In the first embodiment, the first coil 43A and the second coil 44A are opposed to each other in the z-direction with the insulation layers 85 interposed therebetween. Each of the coils 43A and 44A is formed of a conductive layer embedded in one of the insulation layers 85. More specifically, the insulation layer 85 in which one of the coils 43A and 44A is embedded includes grooves extending through the first insulation layer 85a and the second insulation layer 85b in the z-direction. The conductive layers forming the coils 43A and 44A are embedded in the grooves of the insulation layers 85.

In the z-direction, the second coil 44A is located farther away from the substrate 84 than the first coil 43A is. In other words, the second coil 44A is located above the first coil 43A. In other words, the first coil 43A is located closer to the substrate 84 in the z-direction than the second coil 44A is. The arrangement relationship between the first coil 43B and the second coil 44B of the first transformer 41B is the same as the arrangement relationship between the first coil 43A and the second coil 44A of the first transformer 41A.

The dummy pattern 120 and the second coils 44A and 44B are located at the same position in the z-direction. Thus, the dummy pattern 120 is located farther away from the substrate 84 than the first coils 43A and 43B are.

The first transformer chip 80A further includes a protection film 87 formed on the insulation layers 85 and a passivation film 88 formed on the protection film 87. The protection film 87 protects the insulation layers 85 and is formed of, for example, a $SiO_2$ film. The passivation film 88 is a surface protection film of the first transformer chip 80A and is formed of, for example, a SiN film. The passivation film 88 defines the chip main surface 80s of the first transformer chip 80A.

The first electrode pads 81A and the second electrode pads 82A are formed on the insulation layers 85. The protection film 87 and the passivation film 88 are formed to cover a peripheral portion of the upper surface of each of the electrode pads 81A and 82A. This forms an exposed surface on each of the electrode pads 81A and 82A for connecting a wire W.

The first end of the first coil 43A is electrically connected to the first electrode pad 81A for electrical connection to the low-voltage circuit 20 (refer to FIG. 3). This electrically connects the low-voltage circuit 20 and the first coil 43A. The second end of the first coil 43A is electrically connected to a wiring line (not shown) for electrical connection to the ground of the low-voltage circuit 20. This electrically connects the ground of the low-voltage circuit 20 and the first coil 43A.

The first end of the second coil 44A is electrically connected to the second electrode pad 82A for electrical connection to the first end of the first coil 45A (refer to FIG. 3) of the second transformer 42A. The second end of the second coil 44A is electrically connected to the second electrode pad 82A for electrical connection to the second end of the first coil 45A.

As shown in FIGS. 6 and 7, the second transformer chip 80B and the first transformer chip 80A have substantially the same structure. Thus, the same reference characters are given to those components of the second transformer chip 80B that are the same as the corresponding components of the first transformer chip 80A. Such components will not be described in detail.

As shown in FIG. 6, multiple (in the first embodiment, two) second transformers 42A and multiple (in the first embodiment, two) second transformers 42B are alternately arranged in the x-direction. The multiple second transformers 42A and 42B are aligned with each other in the y-direction and spaced apart from each other in the x-direction. As shown in FIG. 2, in the x-direction, the first transformer 41A and the second transformer 42A are aligned with each other, and the first transformer 41B and the second transformer 42B are aligned with each other.

As shown in FIG. 7, the first coil 45A and the second coil 46A of the second transformer 42A are opposed to each other in the z-direction with the insulation layers 85 interposed therebetween. In the first embodiment, the first coil 45A and the second coil 46A are opposed to each other in the z-direction with the insulation layers 85 interposed therebetween. The distance between the first coil 45A and the second coil 46A in the z-direction is equal to the distance between the first coil 43A and the second coil 44A in the z-direction. In the same manner as the coils 43A and 44A, each of the coils 45A and 46A is formed of a conductive layer embedded in one of the insulation layers 85.

In the z-direction, the second coil 46A is located closer to the substrate 84 than the first coil 45A is. In other words, the second coil 46A is located below the first coil 45A. In other words, the first coil 45A is located farther away from the substrate 84 in the z-direction than the second coil 46A is. The arrangement relationship between the first coil 45B and the second coil 46B of the second transformer 42B is the same as the arrangement relationship between the first coil 45A and the second coil 46A of the second transformer 42A.

In the first embodiment, in the first transformer chip 80A, the first coil 43A and the second coil 44A are separated by a distance D1 (refer to FIG. 5). In the second transformer chip 80B, the first coil 45A and the second coil 46A are separated by a distance D2. The distance D1 is equal to the distance D2. It may be considered that the distance D1 is equal to the distance D2 when the difference between the distance D1 and the distance D2 is, for example, less than or equal to 20% of the distance D1. Also, the distance between the first coil 43B and the second coil 44B in the first transformer chip 80A is equal to the distance between the first coil 45B and the second coil 46B in the second transformer chip 80B.

In the first embodiment, each of the coils 43A, 43B, 44A, 44B, 45A, 45B, 46A, and 46B is formed from a material containing Cu. In an example, each of the coils 43A, 43B, 44A, 44B, 45A, 45B, 46A, and 46B is formed from Cu.

As shown in FIG. 6, a dummy pattern 130 is arranged around the first coils 45A and 45B of the second transformers 42A and 42B. More specifically, the dummy pattern 130 is arranged around coils of the second transformers 42B and 42A that are located closer to the chip main surface 80s of the second transformer chip 80B in the z-direction. In plan view, the dummy pattern 130 is identical in pattern shape to the dummy pattern 120. More specifically, in the same manner as the dummy pattern 120, the dummy pattern 130 includes a first dummy pattern 131, a second dummy pattern 132, and a third dummy pattern 133. The arrangement relationship between the dummy pattern 130 and the first coils 45A and 45B in plan view is the same as the arrangement relationship between the dummy pattern 120 and the second coils 44A and 44B in plan view. The dummy pattern 130 and the dummy pattern 120 are formed from the same material. The first dummy pattern 131 is electrically connected to, for example, at least one of the first coils 45A and 45B. The third dummy pattern 133 is electrically connected to, for example, the first dummy pattern 131. The second dummy pattern 132 is electrically floating.

The dummy pattern 130 and the first coils 45A and 45B are located at the same position in the z-direction. Thus, the dummy pattern 130 is located farther away from the substrate 84 than the second coils 46A and 46B are.

The first end of the first coil 45A is electrically connected to the first electrode pad 81B for electrical connection to the first end of the second coil 44A. This electrically connects the first end of the second coil 44A and the first end of the first coil 45A. The second end of the first coil 45A is electrically connected to the first electrode pad 81B for electrical connection to the second end of the second coil 44A. This electrically connects the second end of the second coil 44A and the first end of the first coil 45A.

The first end of the second coil 46A is electrically connected to the second electrode pad 82B for electrical connection to the high-voltage circuit 30. This electrically connects the first end of the second coil 46A and the high-voltage circuit 30. The second end of the second coil 46A is electrically connected to a wiring line (not shown) for electrical connection to the ground of the high-voltage circuit 30. This electrically connects the ground of the high-voltage circuit 30 and the second end of the second coil 46A. In the same manner as the first coil 45A and the second coil 46A, the first coil 45B and the second coil 46B are electrically connected to the first electrode pad 81B and the second electrode pad 82B.

As described above, in the first embodiment, the first transformer chip 80A and the second transformer chip 80B have the same structure. That is, transformer chips having an identical structure are used in the first transformer chip 80A and the second transformer chip 80B. In the first embodiment, as shown in FIG. 2, the orientation of the second transformer chip 80B differs from the orientation of the first transformer chip 80A. More specifically, the second transformer chip 80B is rotated by 180 degrees from the orientation of the first transformer chip 80A and is disposed on the high-voltage die pad 101. Therefore, the first electrode pads 81B of the second transformer chip 80B are located between the second electrode pads 82A of the first transformer chip 80A and the second electrode pads 82B of the second transformer chip 80B in the y-direction. As a result, the second electrode pads 82B, which are electrically connected to the second coils 44A and 44B, are located close to the high-voltage circuit chip 70.

Operation of First Embodiment

The operation of the gate driver 10 according to the first embodiment will now be described.

The insulation voltage of the transformer 40 is determined based on mainly the distance between the first coil 43A (43B) and the second coil 44A (44B). Therefore, the dielectric strength of the transformer 40 is improved by increasing the distance between the first coil 43A (43B) and the second coil 44A (44B).

However, since the first coil 43A (43B) and the second coil 44A (44B) are opposed to each other with the insulation layers 85 interposed therebetween, an increase in the distance between the first coil 43A (43B) and the second coil 44A (44B) increases the number of the insulation layers 85 stacked. As a result, the substrate 84 is prone to warpage. In addition, an increase in the number of the insulation layers 85 stacked increases the number of manufacturing steps and results in an increase in manufacturing cost.

In this regard, in the first embodiment, the gate driver 10 includes the first transformer 41A (41B) and the second transformer 42A (42B) that are connected in series to each other, the first transformer chip 80A including the first transformer 41A (41B), and the second transformer chip 80B including the second transformer 42A (42B). As described above, in the structure in which the two transformer chips 80A and 80B are separated from each other, the insulation voltage of the transformer 40 is determined based on mainly the total of the distance between the first coil 43A (43B) and the second coil 44A (44B) of the first transformer 41A (41B) and the distance between the first coil 45A (45B) and the second coil 46A (46B) of the second transformer 42A (42B). This allows for a decrease in the number of the insulation layers 85 stacked in the transformer chips 80A and 80B. Thus, warp of the substrate 84 is limited. In addition, the decrease in the number of the insulation layers 85 stacked in each of the transformer chips 80A and 80B limits an increase in the number of manufacturing steps. Thus, an increase in the manufacturing cost is limited.

Advantages of First Embodiment

The gate driver 10 of the first embodiment obtains the following advantages.

(1-1) The gate driver 10 includes the low-voltage circuit chip 60 including the low-voltage circuit 20 configured to be actuated by application of the first voltage V1, the high-voltage circuit chip 70 including the high-voltage circuit 30 configured to be actuated by application of the second voltage V2 that is higher than the first voltage V1, and the first transformer chip 80A and the second transformer chip 80B that are connected in series to each other. The low-voltage circuit chip 60 and the high-voltage circuit chip 70 are connected by the first transformer chip 80A and the second transformer chip 80B and transmit a set signal and a reset signal through the transformer chips 80A and 80B.

In this structure, the low-voltage circuit 20 and the high-voltage circuit 30 are insulated from each other by the double insulation structure formed of the first transformer chip 80A and the second transformer chip 80B. Thus, the dielectric strength of the gate driver 10 is improved as compared with a structure in which the low-voltage circuit 20 and the high-voltage circuit 30 are insulated from each other by a single transformer chip.

In addition, the first transformer chip 80A and the second transformer chip 80B are arranged separately from the low-voltage circuit chip 60 and the high-voltage circuit chip 70. This allows the low-voltage circuit chips 60 and high-voltage circuit chips 70 to use the common first transformer chip 80A and the common second transformer chip 80B. This reduces the manufacturing costs when manufacturing different types of gate drivers that differ in at least one of the low-voltage circuit chip 60 and the high-voltage circuit chip 70.

(1-2) The first transformer chip 80A and the second transformer chip 80B are disposed between the low-voltage circuit chip 60 and the high-voltage circuit chip 70.

With this structure, when adjacent ones of the chips 60, 70, 80A, and 80B in the arrangement direction (y-direction) of the chips 60, 70, 80A, and 80B are electrically connected to each other by wires W, the wires W do not need to extend over a specific chip. Thus, the connection structure of the wires W is simplified.

(1-3) The gate driver 10 includes the low-voltage die pad 91 on which the low-voltage circuit chip 60 is mounted and the high-voltage die pad 101 on which the high-voltage circuit chip 70 is mounted. The first transformer chip 80A is mounted on the low-voltage die pad 91. The second transformer chip 80B is mounted on the high-voltage die pad 101.

When the encapsulation resin 110 is formed, the encapsulation resin 110 is more likely to have a void in the vicinity of the die pads 91 and 101 as the die pads 91 and 101 are increased in area in plan view. If the first transformer chip 80A and the second transformer chip 80B are mounted on the low-voltage die pad 91, the area of the low-voltage die pad 91 will be excessively increased, and a void may be formed in the vicinity of the low-voltage die pad 91.

In this regard, in the gate driver 10 of the first embodiment, the first transformer chip 80A and the second transformer chip 80B are separately mounted on the low-voltage die pad 91 and the high-voltage die pad 101, respectively. This avoids a situation in which one of the low-voltage die pad 91 and the high-voltage die pad 101 is excessively increased in size. Thus, formation of a void in the encapsulation resin 110 caused by an excessive increase in the area of one of the die pads 91 and 101 is limited.

(1-4) The distance between the first transformer chip 80A and the second transformer chip 80B is greater than each of the distance between the first transformer chip 80A and the low-voltage circuit chip 60 and the distance between the second transformer chip 80B and the high-voltage circuit chip 70.

This structure allows a wire bonder to readily form wires W that connect the second electrode pad 82A of the first transformer chip 80A and the first electrode pad 81B of the second transformer chip 80B.

(1-5) The inventor of the present application has found that when transformer chips having the same insulation voltage are connected in series, the dielectric strength of the gate driver 10 is improved as compared with when transformer chips having different insulation voltages are connected in series.

Hence, in the first embodiment, the insulation voltage of the first transformer chip 80A is set to be equal to the insulation voltage of the second transformer chip 80B. More specifically, the distance D1 between the first coil 43A and the second coil 44A in the first transformer chip 80A is equal to the distance D2 between the first coil 45A and the second coil 46A in the second transformer chip 80B. Also, the distance between the first coil 43B and the second coil 44B in the first transformer chip 80A is equal to the distance between the first coil 45B and the second coil 46B in the second transformer chip 80B. This improves the dielectric strength of the gate driver 10.

(1-6) In a general semiconductor chip such as an LSI, wiring lines are formed from Al. From the viewpoint of facilitation of manufacturing a semiconductor chip, when a transformer is incorporated in the semiconductor chip, the coils of the transformer and the wiring lines of the LSI are formed from the same material, that is, Al. When the coils of the transformer are formed from Al, the flow of the necessary amount of current to the coils is inhibited.

In this regard, in the first embodiment, the transformer chips 80A and 80B are arranged separately from the low-voltage circuit chip 60 and the high-voltage circuit chip 70. This eliminates the need to use Al, which is the same material as that of the wiring lines of the low-voltage circuit 20 and the high-voltage circuit 30, in the coils 43A, 43B, 44A, 44B, 45A, 45B, 46A, and 46B. Specifically, in the first embodiment, the coils 43A, 43B, 44A, 44B, 45A, 45B, 46A, and 46B of the transformer chips 80A and 80B are formed of a material containing Cu. Thus, the necessary amount of current readily flows to the coils 43A, 43B, 44A, 44B, 45A, 45B, 46A, and 46B.

(1-7) The dummy pattern 120 is arranged around the second coils 44A and 44B of the first transformers 41A and 41B, which are located closer to the chip main surface 80s of the first transformer chip 80A. The dummy pattern 120 includes the first dummy pattern 121, the second dummy pattern 122, and the third dummy pattern 123. The second coils 44A and 44B are connected to the high-voltage circuit chip 70 by the second transformer chip 80B. The first dummy pattern 121 is connected to at least one of the second coils 44A and 44B. The third dummy pattern 123 is connected to the first dummy pattern 121.

In this structure, since the first dummy pattern 121 and the second coils 44A and 44B have the same voltage, voltage drop between the first dummy pattern 121 and the second coils 44A and 44B is limited. This limits concentration of electric field on the second coils 44A and 44B.

The second dummy pattern 122 limits an increase in the electric field strength around the second coils 44A and 44B and limits concentration of the electric field on the second electrode pad 82A.

In addition, since the third dummy pattern 123 and the second coils 44A and 44B have the same voltage, voltage drop between the third dummy pattern 123 and the second coils 44A and 44B is limited. This limits concentration of electric field on the second coils 44A and 44B.

The dummy pattern 120 formed as described above improves the dielectric strength of the first transformer chip 80A. Also, the dummy pattern 130 is formed around the first coils 45A and 45B, which are located closer to the chip main surface 80s of the second transformer chip 80B in the second transformers 42A and 42B. The connection configuration between the dummy pattern 130 and the first coils 45A and 45B is the same as the connection configuration between the dummy pattern 120 and the second coils 44A and 44B. This improves the dielectric strength of the second transformer chip 80B.

(1-8) The first transformer chip 80A and the second transformer chip 80B are identical to each other in structure.

In this structure, the insulation voltage of the first transformer chip 80A is equal to the insulation voltage of the second transformer chip 80B. Thus, the dielectric strength of the gate driver 10 is improved as compared with a structure in which the insulation voltage of the first transformer chip 80A differs from the insulation voltage of the second transformer chip 80B. In addition, there is no need to separately manufacture transformer chips having a different structure for the first transformer chip 80A and the second transformer chip 80B. This reduces the manufacturing costs of the first transformer chip 80A and the second transformer chip 80B.

(1-9) In the first transformers 41A and 41B, the first coils 43A and 43B, which are electrically connected to the ground of the low-voltage circuit 20, are disposed closer to the substrate 84 of the first transformer chip 80A than the second coils 44A and 44B are.

In this structure, the substrate 84 of the first transformer chip 80A is also electrically connected to the ground of the low-voltage circuit 20. This allows the first coils 43A and 43B to be disposed close to the substrate 84 without considering insulation between the substrate 84 and the first coils 43A and 43B. Thus, the height of the first transformer chip 80A is reduced.

(1-10) In the second transformers 42A and 42B, the second coils 46A and 46B, which are electrically connected to the ground of the high-voltage circuit 30, are disposed closer to the substrate 84 of the second transformer chip 80B than the first coils 45A and 45B are.

In this structure, the substrate 84 of the second transformer chip 80B is also electrically connected to the ground of the high-voltage circuit 30. This allows the second coils 46A and 46B to be disposed close to the substrate 84 without considering insulation between the substrate 84 and the second coils 46A and 46B. Thus, the height of the second transformer chip 80B is reduced.

Second Embodiment

A second embodiment of a gate driver 10 will be described with reference to FIGS. 8 to 10. The gate driver 10 of the second embodiment differs from the gate driver 10 of the first embodiment mainly in the number of transformers that are connected in series. In the following description, the differences from the first embodiment will be described. The same reference characters are given to those components that are the same as the corresponding components of the gate driver 10 of the first embodiment. Such components will not be described in detail.

Figure 8:
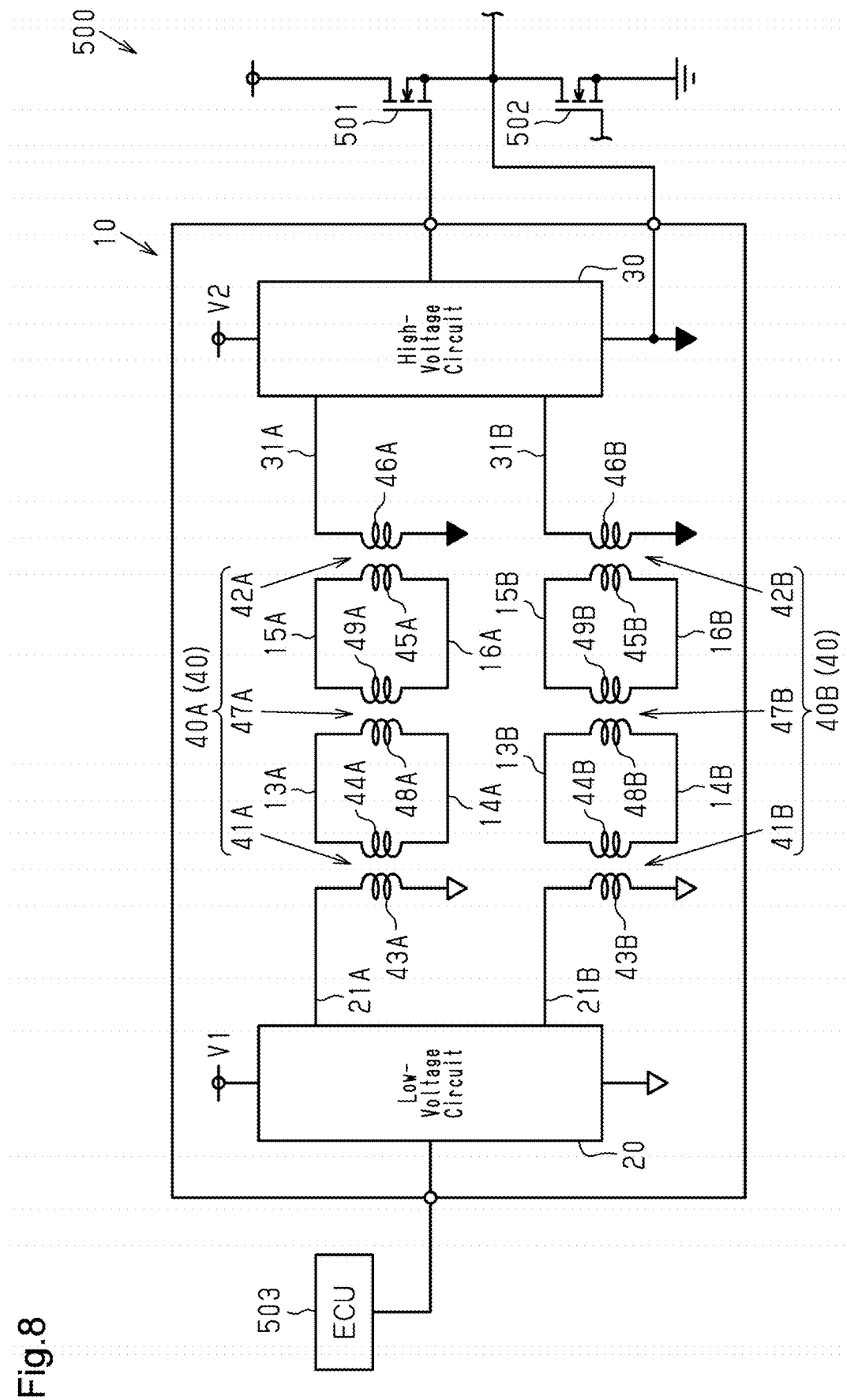
FIG. 8 is a schematic circuit diagram showing a second embodiment of a gate driver.

As shown in FIG. 8, the transformers 40 of the second embodiment include first transformers 41A and 41B, second transformers 42A and 42B, and third transformers 47A and 47B. The first transformer 41A and the third transformer 47A are connected to each other in series. The third transformer 47A and the second transformer 42A are connected to each other in series. Also, the first transformer 41B and the third transformer 47B are connected to each other in series. The third transformer 47B and the second transformer 42B are connected to each other in series. Thus, in the second embodiment, the third transformer 47A is arranged between the first transformer 41A and the second transformer 42A in the circuitry. The third transformer 47B is arranged between the first transformer 41B and the second transformer 42B in the circuitry.

The gate driver 10 of the second embodiment includes two connection signal lines 13A and 14A that connect the first transformer 41A and the third transformer 47A, two connection signal lines 15A and 16A that connect the third transformer 47A and the second transformer 42A, two connection signal lines 13B and 14B that connect the first transformer 41B and the third transformer 47B, and two connection signal lines 15B and 16B that connect the third transformer 47B and the second transformer 42B.

As in the first embodiment, the first transformers 41A and 41B include the first coils 43A and 43B and the second coils 44A and 44B. The second transformers 42A and 42B include the first coils 45A and 45B and the second coils 46A and 46B.

In the second embodiment, the insulation voltage of the third transformers 47A and 47B is set to equal the insulation voltage of the first transformers 41A and 41B and the second transformers 42A and 42B. That is, the insulation voltage of the third transformers 47A and 47B is, for example, greater than or equal to 2500 Vrms and less than or equal to 7500 Vrms. The insulation voltage of the third transformers 47A and 47B may be greater than or equal to 2500 Vrms and less than or equal to 5700 Vrms.

The third transformer 47A includes a first coil 48A and a second coil 49A that is electrically insulated from and configured to be magnetically coupled to the first coil 48A. The third transformer 47B includes a first coil 48B and a second coil 49B that is electrically insulated from and configured to be magnetically coupled to the first coil 48B.

In the same manner as the first embodiment, the first coil 43A of the first transformer 41A is connected to the low-voltage circuit 20 by the low-voltage signal line 21A and is also connected to the ground of the low-voltage circuit 20. In the same manner as the first embodiment, the second coil 46A of the second transformer 42A is connected to the high-voltage circuit 30 by the high-voltage signal line 31A and is also connected to the ground of the high-voltage circuit 30. Thus, the potential of the second end of the first coil 43A equals the first reference potential. The first reference potential is, for example, 0 V.

The second coil 44A of the first transformer 41A is connected to the first coil 48A of the third transformer 47A. In an example, the second coil 44A and the first coil 48A are connected to each other so as to be electrically floating. More specifically, the connection signal line 13A connects a first end of the second coil 44A and a first end of the first coil 48A. The connection signal line 14A connects a second end of the second coil 44A a second end of the first coil 48A.

The second coil 49A of the third transformer 47A is connected to the first coil 45A of the second transformer 42A. In an example, the second coil 49A and the first coil 45A are connected to each other so as to be electrically floating. More specifically, the connection signal line 15A connects a first end of the second coil 49A and a first end of the first coil 45A. The connection signal line 16A connects a second end of the second coil 49A a second end of the first coil 45A.

Thus, the second coil 44A, the first coil 48A, the second coil 49A, and the first coil 45A serve as relay coils that relay transmission of a signal between the first coil 43A and the second coil 46A.

In the same manner as the first embodiment, the second coil 46A of the second transformer 42A is connected to the high-voltage circuit 30 by the high-voltage signal line 31A and is also connected to the ground of the high-voltage circuit 30. Thus, the potential of the second end of the second coil 46A equals the second reference potential. The ground of the high-voltage circuit 30 is connected to the source of the switching element 501. Thus, the second reference potential fluctuates as the inverter device 500 is driven and may become, for example, greater than or equal to 600 V.

The connection configuration of the first transformer 41B, the third transformer 47B, and the second transformer 42B is the same as the connection configuration of the first transformer 41A, the third transformer 47A, and the second transformer 42A and thus will not be described in detail.

A set signal output from the low-voltage circuit 20 is transmitted through the first transformer 41A, the third transformer 47A, and the second transformer 42A to the high-voltage circuit 30. A reset signal output from the low-voltage circuit 20 is transmitted through the first transformer 41B, the third transformer 47B, and the second transformer 42B to the high-voltage circuit 30.

Figure 9:
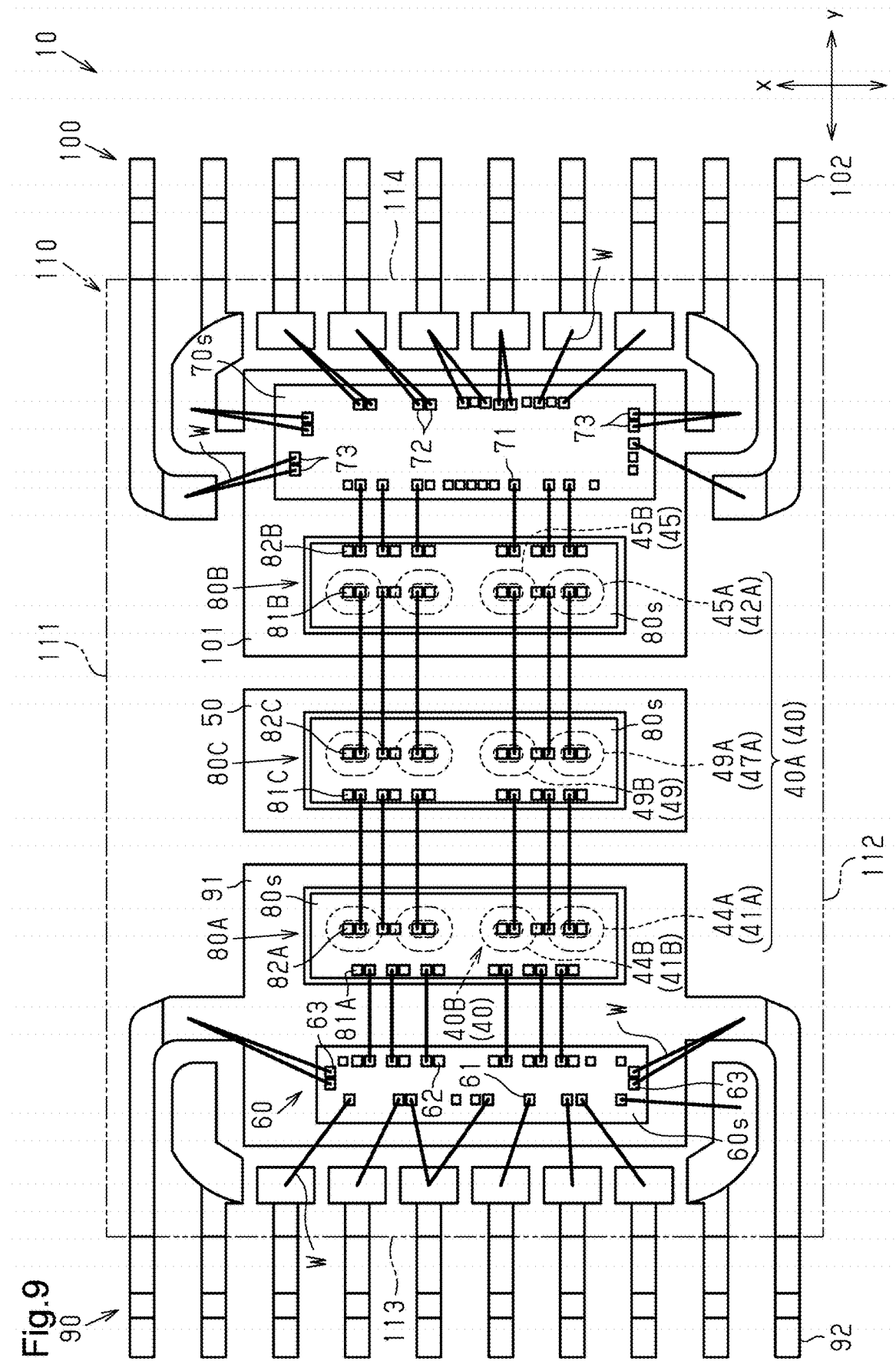
FIG. 9 is a plan view showing an internal structure of the gate driver of the second embodiment.

FIG. 9 shows an example of a plan view showing the internal structure of the gate driver 10. FIG. 8 shows a simplified circuit configuration of the gate driver 10. Hence, the number of external terminals of the gate driver 10 shown in FIG. 9 is greater than the number of external terminals of the gate driver 10 shown in FIG. 8. The number of external terminals of the gate driver 10 is the number of external electrodes configured to connect the gate driver 10 to electronic components arranged outside the gate driver 10, such as the ECU 503 and the switching element 501 (refer to FIG. 8). The number of signal lines (the number of wires W described later) that transmit a signal from the low-voltage circuit 20 to the high-voltage circuit 30 in the gate driver 10 shown in FIG. 9 is greater than the number of signal lines in the gate driver 10 shown in FIG. 8. In FIG. 9, the encapsulation resin 110 is indicated by double-dashed lines to illustrate the internal structure of the gate driver 10.

The gate driver 10 includes three transformer chips, namely, a first transformer chip 80A, a second transformer chip 80B, and a third transformer chip 80C, and a floating die pad 50 on which the third transformer chip 80C is mounted, which differ from that of the first embodiment.

The floating die pad 50 is disposed between the low-voltage die pad 91 of the low-voltage lead frame 90 and the high-voltage die pad 101 of the high-voltage lead frame 100 in the y-direction. More specifically, the floating die pad 50 is disposed between the low-voltage die pad 91 and the high-voltage die pad 101 in the arrangement direction of the low-voltage die pad 91 and the high-voltage die pad 101. The floating die pad 50 is formed of Cu, which is the same as the lead frames 90 and 100. In the second embodiment, the floating die pad 50 is not exposed from the encapsulation resin 110. The area of the floating die pad 50 in plan view is smaller than each of the area of the low-voltage die pad 91 in plan view and the area of the high-voltage die pad 101 in plan view. In the second embodiment, the floating die pad 50 is equal to each of the die pads 91 and 101 in dimension in the x-direction. The floating die pad 50 is less than each of the die pads 91 and 101 in dimension in the y-direction. The floating die pad 50 is not in contact with the lead frames 90 and 100. Therefore, the floating die pad 50 is electrically floating.

In the same manner as the first embodiment, the low-voltage circuit chip 60 and the first transformer chip 80A are mounted on the low-voltage die pad 91. The high-voltage circuit chip 70 and the second transformer chip 80B are mounted on the high-voltage die pad 101.

The low-voltage circuit chip 60, the high-voltage circuit chip 70, and the transformer chips 80A to 80C are spaced apart from each other in the y-direction. The low-voltage circuit chip 60, the first transformer chip 80A, the third transformer chip 80C, the second transformer chip 80B, and the high-voltage circuit chip 70 are arranged in this order in the y-direction from the low-voltage leads 92 toward the high-voltage leads 102.

In the same manner as the first embodiment, the first transformer chip 80A includes the first transformers 41A and 41B. The second transformer chip 80B includes the second transformers 42A and 42B.

The third transformer chip 80C includes the third transformers 47A and 47B. The shape of the third transformer chip 80C is identical to the shapes of the first transformer chip 80A and the second transformer chip 80B. As shown in FIG. 10, the third transformer chip 80C includes a chip main surface 80s and a chip back surface 80r facing opposite directions in the z-direction. The chip back surface 80r of the third transformer chip 80C is bonded to the floating die pad 50 by the conductive bonding material SD.

As shown in FIG. 9, first electrode pads 81C and second electrode pads 82C are formed on the chip main surface 80s of the third transformer chip 80C. The first electrode pads 81C are disposed, for example, on one of the opposite ends of the chip main surface 80s in the y-direction located closer to the first transformer chip 80A. The first electrode pads 81C are arranged in the x-direction. The second electrode pads 82C are arranged near the center of the chip main surface 80s in the y-direction. The second electrode pads 82C are arranged in the x-direction.

Each of the lead frames 90 and 100 is located closest to the floating die pad 50 at the low-voltage die pad 91 and the high-voltage die pad 101, respectively. Therefore, each of the low-voltage die pad 91 and the high-voltage die pad 101 needs to be separated from the floating die pad 50 by a certain distance or more so that the insulation voltage of the gate driver 10 is set to a predetermined insulation voltage. Hence, in plan view, each of the distance between the first transformer chip 80A and the third transformer chip 80C and the distance between the third transformer chip 80C and the second transformer chip 80B is greater than each of the distance between the low-voltage circuit chip 60 and the first transformer chip 80A and the distance between the high-voltage circuit chip 70 and the second transformer chip 80B. In the second embodiment, the distance between the first transformer chip 80A and the third transformer chip 80C is equal to the distance between the third transformer chip 80C and the second transformer chip 80B in plan view.

The third transformer chip 80C and the first transformer chip 80A have the same structure. More specifically, two sets of the third transformers 47A and 47B are arranged on the third transformer chip 80C. The first coils 48A and 48B and the second coils 49A and 49B of the transformers 47A and 47B are embedded in the insulation layers 85.

Figure 10:
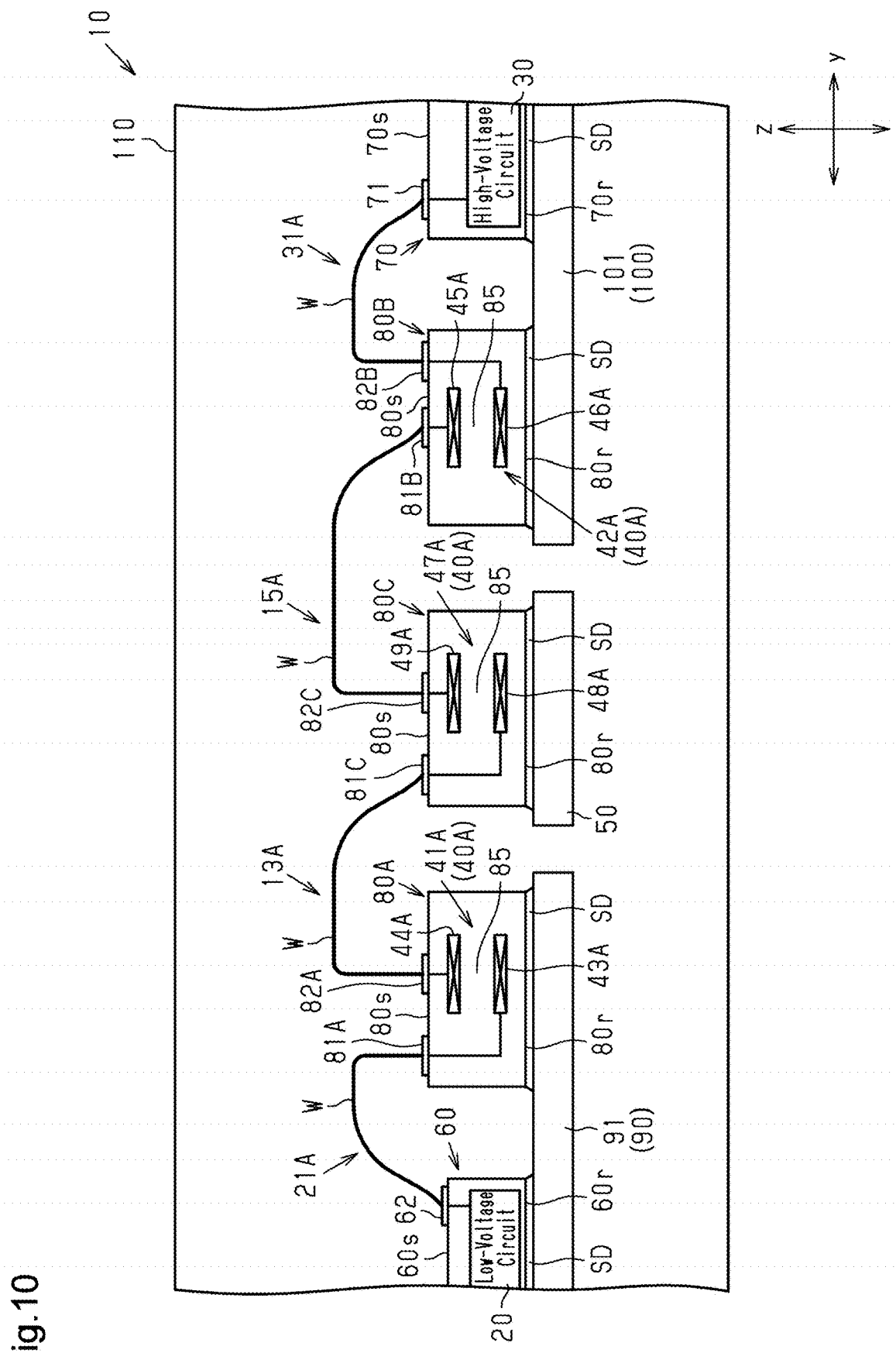
FIG. 10 is a schematic cross-sectional view showing a portion of the gate driver shown in FIG. 9.

As shown in FIG. 10, the first coil 48A and the second coil 49A are opposed to each other in the z-direction with the insulation layers 85 interposed therebetween. The second coil 49A is located farther away from the substrate 84 than the first coil 48A is. Although not illustrated, the first coil 48B and the second coil 49B are also opposed to each other in the z-direction with the insulation layers 85 interposed therebetween. The second coil 49B is located farther away from the substrate 84 than the first coil 48B is.

In the second embodiment, the distance between the first coil 48A and the second coil 49A in the z-direction is equal to each of the distance D1 (refer to FIG. 5) between the first coil 43A and the second coil 44A in the z-direction and the distance D2 (refer to FIG. 7) between the first coil 45A and the second coil 46A in the z-direction. It may be considered that the distance between the first coil 48A and the second coil 49A in the z-direction is equal to the distances D1 and D2 when the difference of the distance between the first coil 48A and the second coil 49A in the z-direction from the distances D1 and D2 is, for example, within 20% of the distance D1. Although not illustrated, the distance between the first coil 48B and the second coil 49B in the z-direction is also equal to the distances D1 and D2.

Although not illustrated, a dummy pattern is formed around the second coils 49A and 49B. More specifically, the dummy pattern is arranged around coils of the third transformers 47A and 47B that are located closer to the chip main surface 80s of the third transformer chip 80C in the z-direction. The dummy pattern arranged around the second coils 49A and 49B is formed at the same position as the second coils 49A and 49B in the z-direction. Thus, the dummy pattern is located farther away from the substrate (not shown) of the third transformer chip 80C than the first coils 48A and 48B are. In plan view, the dummy pattern around the second coils 49A and 49B is identical in pattern shape to the dummy patterns 120 and 130 (refer to FIGS. 4 and 6) of the transformer chips 80A and 80B.

The first end of the first coil 48A is electrically connected to the first electrode pad 81C for electrical connection to the first end of the second coil 44A of the first transformer 41A. The second end of the first coil 48A is electrically connected to the first electrode pad 81C for electrical connection to the second end of the second coil 44A.

The first end of the second coil 49A is electrically connected to the second electrode pad 82C for electrical connection to the first end of the first coil 43A of the second transformer 42A. The second end of the second coil 49A is electrically connected to the second electrode pad 82C for electrical connection to the second end of the first coil 43A.

Although not illustrated, the first coil 48B is also electrically connected to the first electrode pad 81C for electrical connection to the second coil 44B of the first transformer 41B. Also, the second coil 49B is electrically connected to the second electrode pad 82C for electrical connection to the first coil 43B of the second transformer 42B.

Thus, the third transformer chip 80C uses the same transformer chip as the first transformer chip 80A and the second transformer chip 80B. In other words, the first transformer chip 80A, the second transformer chip 80B, and the third transformer chip 80C are identical to each other in structure. In the second embodiment, as shown in FIG. 10, the orientation of the second transformer chip 80B differs from the orientation of the first transformer chip 80A. The orientation of the third transformer chip 80C is the same as the orientation of the first transformer chip 80A. That is, the orientation of the second transformer chip 80B differs from the orientation of the third transformer chip 80C. More specifically, the second transformer chip 80B is rotated by 180 degrees from the third transformer chip 80C and is disposed on the high-voltage die pad 101. Therefore, the first electrode pads 81B of the second transformer chip 80B are located between the second electrode pads 82C of the third transformer chip 80C and the second electrode pads 82B of the second transformer chip 80B in the y-direction. As a result, the second electrode pads 82B, which are electrically connected to the second coils 44A and 44B, are located close to the high-voltage circuit chip 70.

As shown in FIGS. 9 and 10, the first electrode pads 81C of the third transformer chip 80C are connected to the second electrode pads 82A of the first transformer chip 80A by wires W. The second electrode pads 82C of the third transformer chip 80C are individually connected to the second electrode pads 82B of the second transformer chip 80B by wires W. Thus, the second coil 44A of the first transformer 41A and the first coil 48A of the third transformer 47A are electrically connected to each other. The second coil 49A of the third transformer 47A and the first coil 43A of the second transformer 42A are electrically connected to each other. Also, the second coil 44B of the first transformer 41B and the first coil 48B of the third transformer 47B are electrically connected to each other. The second coil 49B of the third transformer 47B and the first coil 43B of the second transformer 42B are electrically connected to each other.

Advantages of Second Embodiment

The gate driver 10 of the second embodiment obtains the following advantages in addition to the advantages of the first embodiment.

(2-1) The gate driver 10 includes three transformer chips, namely, the first transformer chip 80A, the second transformer chip 80B, and the third transformer chip 80C. The first transformer chip 80A and the third transformer chip 80C are connected in series to each other. The third transformer chip 80C and the second transformer chip 80B are connected in series to each other.

In this structure, the first transformer 41A, the second transformer 42A, and the third transformer 47A form a multi-insulation structure between the low-voltage circuit 20 and the high-voltage circuit 30 in the signal line that transmits the set signal. The first transformer 41B, the second transformer 42B, and the third transformer 47B form a multi-insulation structure between the low-voltage circuit 20 and the high-voltage circuit 30 in the signal line that transmits the reset signal. This improves the dielectric strength of the gate driver 10.

(2-2) The third transformer chip 80C is mounted on the floating die pad 50 arranged separately from the low-voltage die pad 91 and the high-voltage die pad 101.

In this structure, the third transformer chip 80C is mounted on the floating die pad 50, which is arranged separately from the two die pads 91 and 101. Thus, the distance from the third transformer chip 80C to each of the low-voltage die pad 91 and the high-voltage die pad 101 is increased as compared to a structure in which the third transformer chip 80C is mounted on one of the low-voltage die pad 91 and the high-voltage die pad 101. As a result, the distance from the coils 48A, 48B, 49A, and 49B of the third transformers 47A and 47B to each of the low-voltage die pad 91 and the high-voltage die pad 101 is increased. This allows for improvement in the dielectric strength of the gate driver 10 without setting the distance between the substrate 84 and each of the coils 48A and 48B, which are located closer to the substrate 84 in the insulation layers 85, to be greater than the distance between the substrate 84 and each of the coils 43A, 43B, 45A, and 45B located closer to the substrate 84 in the transformer chips 80A and 80B. Thus, for example, the third transformer chip 80C and the first transformer chip 80A may have the same structure. This eliminates the need to manufacture different types of transformer chips and reduces the manufacturing cost of the gate driver 10.

(2-3) The floating die pad 50 is electrically floating. This structure limits application of a high voltage between the substrate 84 and the first coils 48A and 48B, which are located closer to the substrate 84 than the second coils 49A and 49B are in the third transformer chip 80C. The insulation voltage of the third transformer chip 80C is set based on the insulation voltage between the first coil 48A (48B) and the second coil 49A (49B). Thus, the insulation voltage of the third transformer chip 80C is easily set.

(2-3) The first transformer chip 80A, the second transformer chip 80B, and the third transformer chip 80C are identical to each other in structure.

In this structure, the insulation voltage of the first transformer chip 80A, the insulation voltage of the second transformer chip 80B, and the insulation voltage of the third transformer chip 80C are equal to each other. Thus, the dielectric strength of the gate driver 10 is improved as compared to a structure in which the insulation voltage of the first transformer chip 80A, the insulation voltage of the second transformer chip 80B, and the insulation voltage of the third transformer chip 80C differ from each other. In addition, there is no need to separately manufacture transformer chips having a different structure for the first transformer chip 80A, the second transformer chip 80B, and the third transformer chip 80C. This reduces the manufacturing cost of the first transformer chip 80A, the second transformer chip 80B, and the third transformer chip 80C.

Third Embodiment

A third embodiment of a gate driver 10 will be described with reference to FIGS. 11 and 12. The gate driver 10 of the third embodiment differs from the gate driver 10 of the first embodiment mainly in that the gate driver 10 of the third embodiment includes a plurality of packages. In the following description, the differences from the first embodiment will be described. The same reference characters are given to those components that are the same as the corresponding components of the gate driver 10 of the first embodiment. Such components will not be described in detail.

Figure 11:
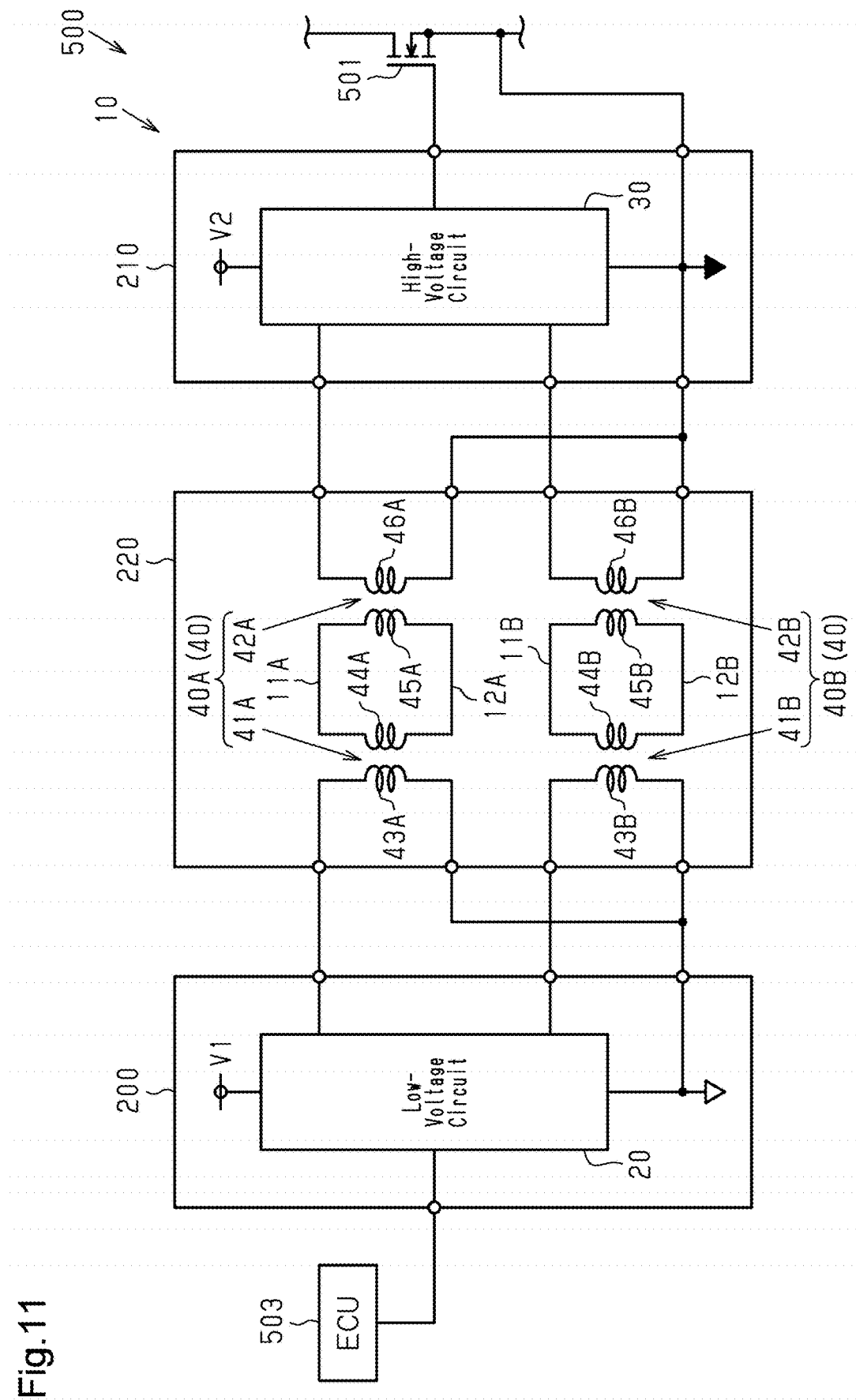
FIG. 11 is a schematic circuit diagram showing a third embodiment of a gate driver.

As shown in FIG. 11, the gate driver 10 of the third embodiment has the same circuit configuration as the gate driver 10 of the first embodiment. The gate driver 10 includes a low-voltage circuit module 200, a high-voltage circuit module 210, and an insulation module 220.

The low-voltage circuit module 200 includes a low-voltage circuit 20. In an example, although not illustrated, the low-voltage circuit module 200 includes a low-voltage circuit chip including the low-voltage circuit 20, a low-voltage lead frame including a low-voltage die pad on which the low-voltage circuit chip is mounted, and an encapsulation resin encapsulating a part of the low-voltage lead frame and the low-voltage circuit chip.

The high-voltage circuit module 210 includes a high-voltage circuit 30. In an example, although not illustrated, the high-voltage circuit module 210 includes a high-voltage circuit chip including the high-voltage circuit 30, a high-voltage lead frame including a high-voltage die pad on which the high-voltage circuit chip is mounted, and an encapsulation resin encapsulating a part of the high-voltage lead frame and the high-voltage circuit chip.

The insulation module 220 insulates the low-voltage circuit 20 from the high-voltage circuit 30 while allowing transmission of the set signal and the reset signal from the low-voltage circuit 20 to the high-voltage circuit 30. That is, the insulation module 220 is used to insulate the low-voltage circuit 20 and the high-voltage circuit 30 included in the gate driver 10. The insulation module 220 includes transformers 40. In the same manner as the first embodiment, the transformers 40 are used to transmit signals (set signal and reset signal) between the low-voltage circuit 20 and the high-voltage circuit 30. As shown in FIG. 11, the insulation module 220 is disposed between the low-voltage circuit 20 and the high-voltage circuit 30 in the circuitry. Thus, the low-voltage circuit 20 and the high-voltage circuit 30 are connected by the transformers 40.

Figure 12:
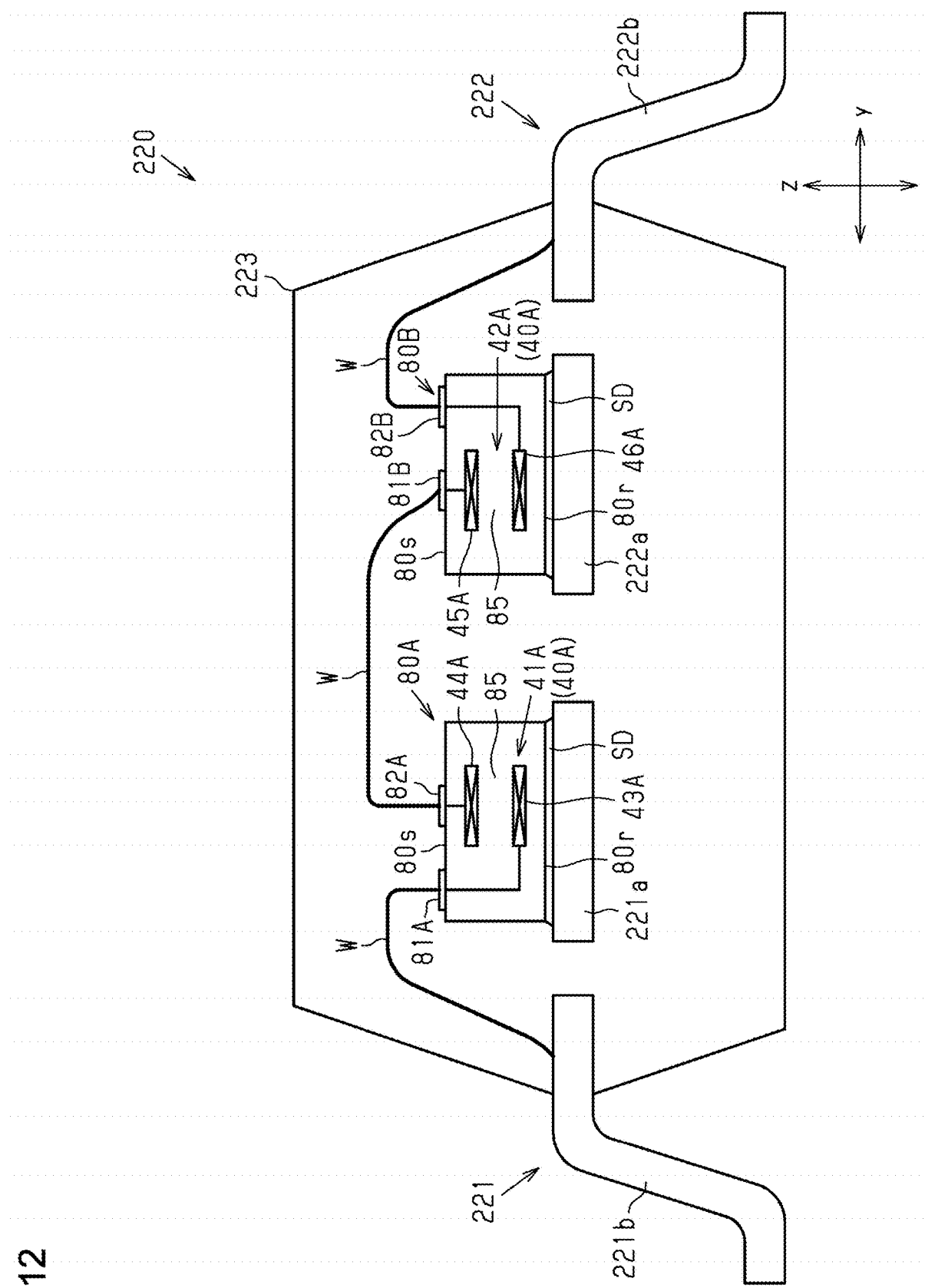
FIG. 12 is a schematic cross-sectional view of an insulation module in the gate driver according to the third embodiment.

FIG. 12 shows an example of a schematic cross-sectional structure of the insulation module 220. As shown in FIG. 12, the insulation module 220 includes a first transformer chip 80A, a second transformer chip 80B, a low-voltage lead frame 221, a high-voltage lead frame 222, and an encapsulation resin 223 that encapsulates the first transformer chip 80A, the second transformer chip 80B, and a part of each of the lead frames 221 and 222.

The lead frames 221 and 222 are formed from a conductor and, in the third embodiment, are formed from Cu. The lead frames 221 and 222 are disposed to extend from the inside to the outside of the encapsulation resin 223.

The low-voltage lead frame 221 is electrically connected to the low-voltage circuit 20 (refer to FIG. 11) and includes a low-voltage die pad 221a disposed in the encapsulation resin 223 and a plurality of low-voltage leads 221b disposed to extend from the inside to the outside of the encapsulation resin 223. Each of the low-voltage leads 221b includes an external terminal electrically connected to the low-voltage circuit 20.

The high-voltage lead frame 222 is electrically connected to the high-voltage circuit 30 (refer to FIG. 11) and includes a high-voltage die pad 222a disposed in the encapsulation resin 223 and a plurality of high-voltage leads 222b disposed to extend from the inside to the outside of the encapsulation resin 223. Each of the high-voltage leads 222b includes an external terminal electrically connected to the high-voltage circuit 30.

In the third embodiment, the first transformer chip 80A is mounted on the low-voltage die pad 221a, and the second transformer chip 80B is mounted on the high-voltage die pad 222a.

In the third embodiment, the first transformer chip 80A and the second transformer chip 80B are arranged in this order from the low-voltage leads 221b toward the high-voltage leads 222b.

In the gate driver 10, the first coils 43A and 43B (refer to FIG. 11) of the first transformers 41A in the transformers 40A and 40B are electrically connected to the low-voltage circuit 20 and are also connected to the ground of the low-voltage circuit 20. More specifically, each of the first coils 43A and 43B includes a first end electrically connected to the low-voltage circuit 20 and a second end connected to the ground of the low-voltage circuit 20.

The first electrode pad 81A of the first transformer chip 80A and a low-voltage lead 221b are connected by a wire W. This electrically connects the first coil 43A of the first transformer 41A to the low-voltage lead 221b. Although not illustrated, the first coil 43B of the first transformer 41B is electrically connected to another low-voltage lead 221b. Also, although not illustrated, the first coils 43A and 43B of the first transformers 41A and 41B are connected by wires W to low-voltage leads 221b integrated with the low-voltage die pad 221a.

In the gate driver 10, the second coils 44A and 44B (refer to FIG. 11) of the first transformers 41A and 41B are electrically connected to the first coils 45A and 45B of the second transformers 42A and 42B. In other words, the first ends of the second coils 44A and 44B are connected to the first ends of the first coils 45A and 45B, and the second ends of the second coils 44A and 44B are connected to the second ends of the first coils 45A and 45B.

The second electrode pad 82A of the first transformer chip 80A and the first electrode pad 81B of the second transformer chip 80B are connected by a wire W. This electrically connects the second coil 44A of the first transformer 41A to the first coil 45A of the second transformer 42A. Although not illustrated, the second coil 44B of the first transformer 41B and the first coil 45B of the second transformer 42B are electrically connected to each other.

In the gate driver 10, the second coils 46A and 46B (refer to FIG. 11) of the second transformers 42A and 42B are electrically connected to the high-voltage circuit 30 and are also connected to the ground of the high-voltage circuit 30. More specifically, the second coils 46A and 46B each include a first end electrically connected to the high-voltage circuit 30 and a second end electrically connected to the ground of the high-voltage circuit 30.

The second electrode pad 82B of the second transformer chip 80B and the high-voltage lead 222b are connected by a wire W. This electrically connects the second coil 46A of the second transformer 42A and the high-voltage lead 222b. Although not illustrated, the second coil 46B of the second transformer 42B and the high-voltage lead 222b are electrically connected to each other. Although not illustrated, the second coils 46A and 46B of the second transformers 42A and 42B are connected by wires W to the high-voltage leads 222b integrated with the high-voltage die pad 222a.

Advantage of Third Embodiment

The gate driver 10 of the third embodiment obtains the following advantages in addition to the advantages of the first embodiment.

(3-1) The transformers 40 are included in the insulation module 220, which is a semiconductor module differing from the low-voltage circuit module 200 and the high-voltage circuit module 210.

This structure allows the common insulation module 220 to be used for the low-voltage circuit module 200 and high-voltage circuit module 210, which differ from each other. This reduces the manufacturing cost when manufacturing different types of gate drivers that differ in at least one of the low-voltage circuit module 200 and the high-voltage circuit module 210.

Fourth Embodiment

A fourth embodiment of a gate driver 10 will be described with reference to FIGS. 13 and 14. The gate driver 10 of the fourth embodiment differs from the gate driver 10 of the first embodiment mainly in that the gate driver 10 of the fourth embodiment includes a plurality of packages. In the following description, the differences from the first embodiment will be described. The same reference characters are given to those components that are the same as the corresponding components of the gate driver 10 of the first embodiment. Such components will not be described in detail.

Figure 13:
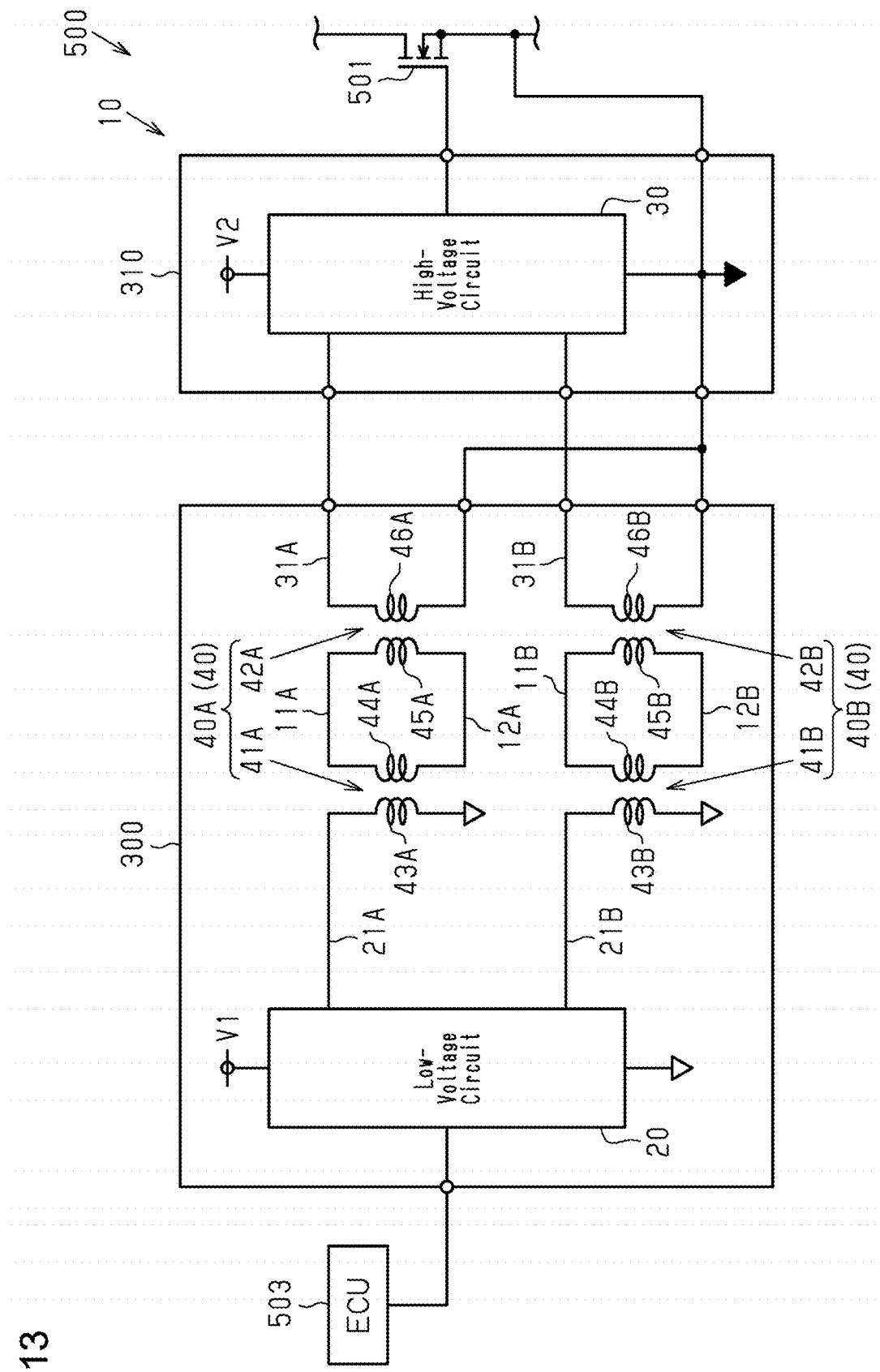
FIG. 13 is a schematic circuit diagram showing a fourth embodiment of a gate driver.

As shown in FIG. 13, the gate driver 10 of the fourth embodiment has the same circuit configuration as the gate driver 10 of the first embodiment. The gate driver 10 includes a low-voltage circuit unit 300 and a high-voltage circuit module 310. The high-voltage circuit module 310 has the same structure as the high-voltage circuit module 210 (refer to FIG. 11) of the fourth embodiment.

The low-voltage circuit unit 300 includes a low-voltage circuit 20 and transformers 40. The low-voltage circuit unit 300 insulates the low-voltage circuit 20 from the high-voltage circuit 30 while allowing transmission of the set signal and the reset signal from the low-voltage circuit 20 to the high-voltage circuit 30.

Figure 14:
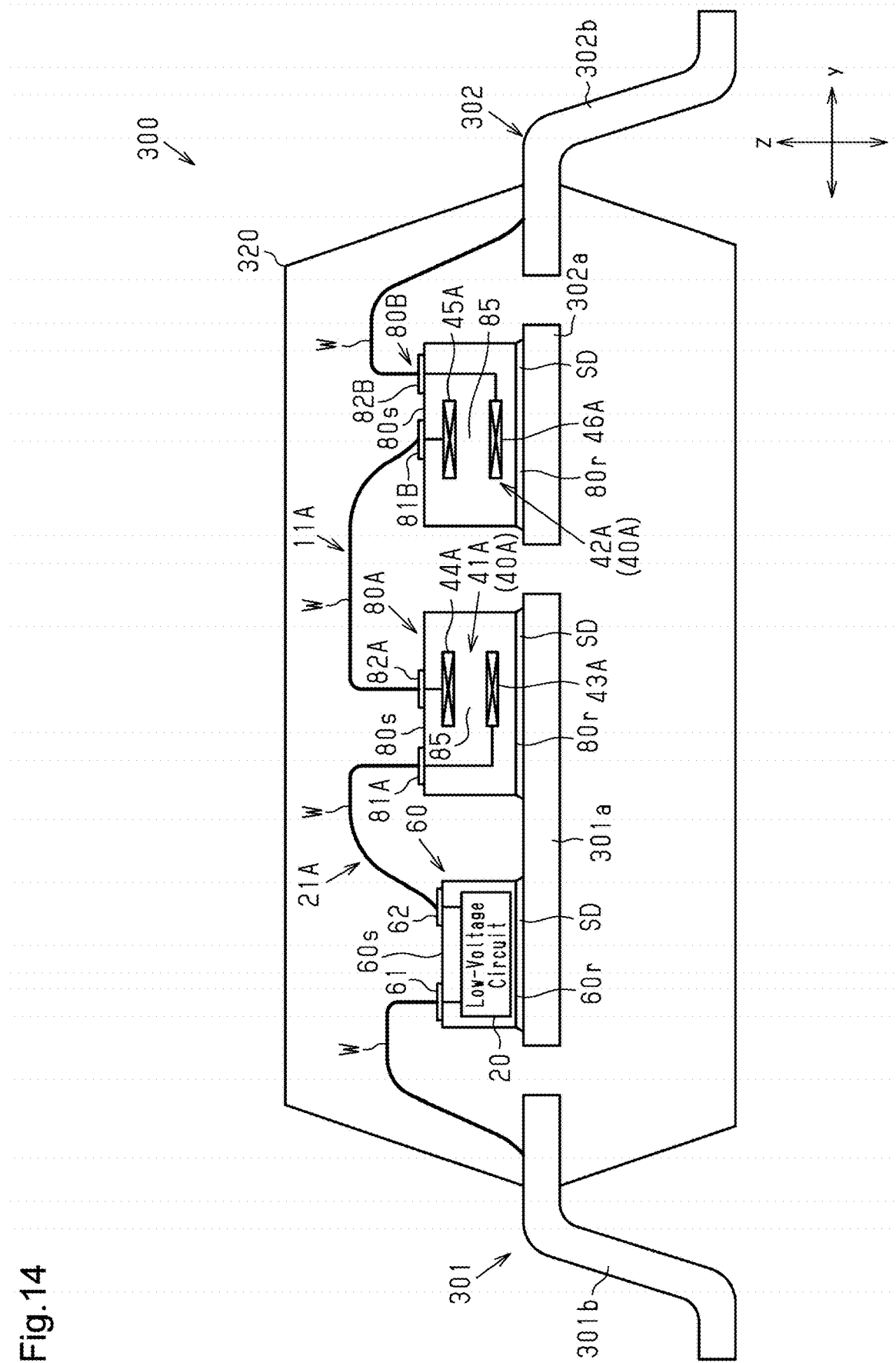
FIG. 14 is a schematic cross-sectional view of a low-voltage circuit unit in the gate driver according to the fourth embodiment.

FIG. 14 shows an example of a schematic cross-sectional structure of the low-voltage circuit unit 300. As shown in FIG. 14, the low-voltage circuit unit 300 includes a low-voltage circuit chip 60 including the low-voltage circuit 20, a first transformer chip 80A, a second transformer chip 80B, a low-voltage lead frame 301, a high-voltage lead frame 302, and an encapsulation resin 320 that encapsulates the chips 60, 80A, and 80B and a part of each of the lead frames 301 and 302. In other words, the low-voltage circuit unit 300 includes an insulation module that includes the transformers 40. That is, the low-voltage circuit unit 300 includes the insulation module and the low-voltage circuit 20 (refer to FIG. 13). In other words, the insulation module includes the first transformer chip 80A and the second transformer chip 80B.

The lead frames 301 and 302 are formed from a conductor and, in the fourth embodiment, are formed from Cu. The lead frames 301 and 302 are disposed to extend from the inside to the outside of the encapsulation resin 320.

The low-voltage lead frame 301 is electrically connected to the low-voltage circuit 20 and includes a low-voltage die pad 301a disposed in the encapsulation resin 320 and a plurality of low-voltage leads 301b disposed to extend from the inside to the outside of the encapsulation resin 320. Each of the low-voltage leads 301b includes an external terminal electrically connected to the low-voltage circuit 20.

The high-voltage lead frame 302 is electrically connected to the high-voltage circuit 30 (refer to FIG. 13) and includes a high-voltage die pad 302a disposed in the encapsulation resin 320 and a plurality of high-voltage leads 302b disposed to extend from the inside to the outside of the encapsulation resin 320. Each of the high-voltage leads 302b includes an external terminal electrically connected to the high-voltage circuit 30.

In the fourth embodiment, the low-voltage circuit chip 60 and the first transformer chip 80A are mounted on the low-voltage die pad 301a. The second transformer chip 80B is mounted on the high-voltage die pad 302a. The low-voltage circuit chip 60, the first transformer chip 80A, and the second transformer chip 80B are spaced apart from each other in the y-direction. In the fourth embodiment, the low-voltage circuit chip 60, the first transformer chip 80A, and the second transformer chip 80B are arranged in this order from the low-voltage leads 301b toward the high-voltage leads 302b.

The low-voltage circuit chip 60, the first transformer chip 80A, and the second transformer chip 80B are connected by wires W in the same manner as those of the first embodiment. The second electrode pads 82B of the second transformer chip 80B are connected to the high-voltage leads 302b by wires W. The fourth embodiment has the same advantages as the first embodiment.

Fifth Embodiment

A fifth embodiment of a gate driver 10 will be described with reference to FIGS. 15 and 16. The gate driver 10 of the fifth embodiment differs from the gate driver 10 of the first embodiment mainly in that the gate driver 10 of the fifth embodiment includes a plurality of packages. In the following description, the differences from the first embodiment will be described. The same reference characters are given to those components that are the same as the corresponding components of the gate driver 10 of the first embodiment. Such components will not be described in detail.

Figure 15:
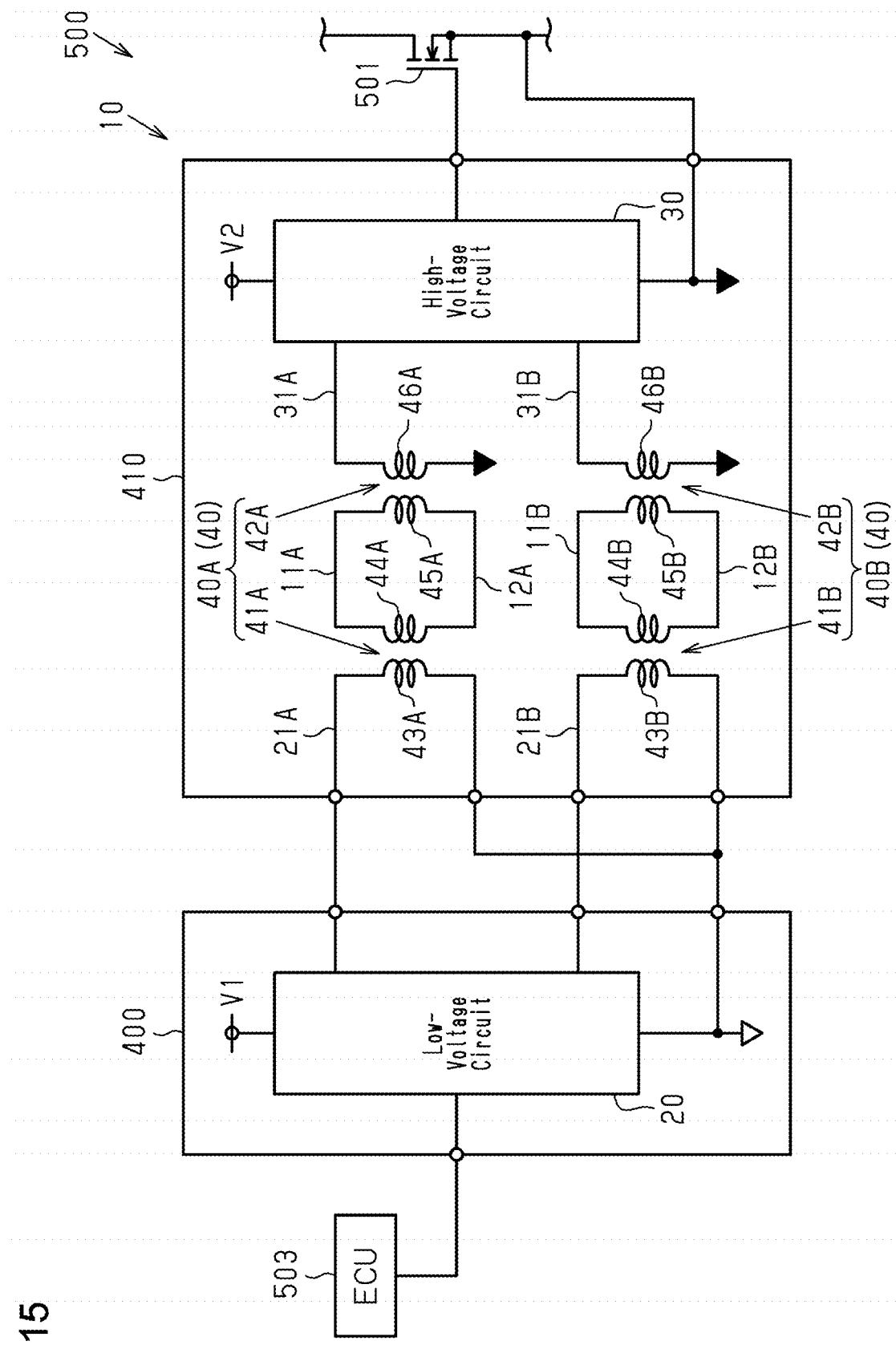
FIG. 15 is a schematic circuit diagram showing a fifth embodiment of a gate driver.

As shown in FIG. 15, the gate driver 10 of the fifth embodiment has the same circuit configuration as the gate driver 10 of the first embodiment. The gate driver 10 includes a low-voltage circuit module 400 and a high-voltage circuit unit 410. The low-voltage circuit module 400 has the same structure as the low-voltage circuit module 200 (refer to FIG. 11) of the fifth embodiment.

The high-voltage circuit unit 410 includes a high-voltage circuit 30 and transformers 40. The high-voltage circuit unit 410 insulates the low-voltage circuit 20 from the high-voltage circuit 30 while allowing transmission of the set signal and the reset signal from the low-voltage circuit 20 to the high-voltage circuit 30.

Figure 16:
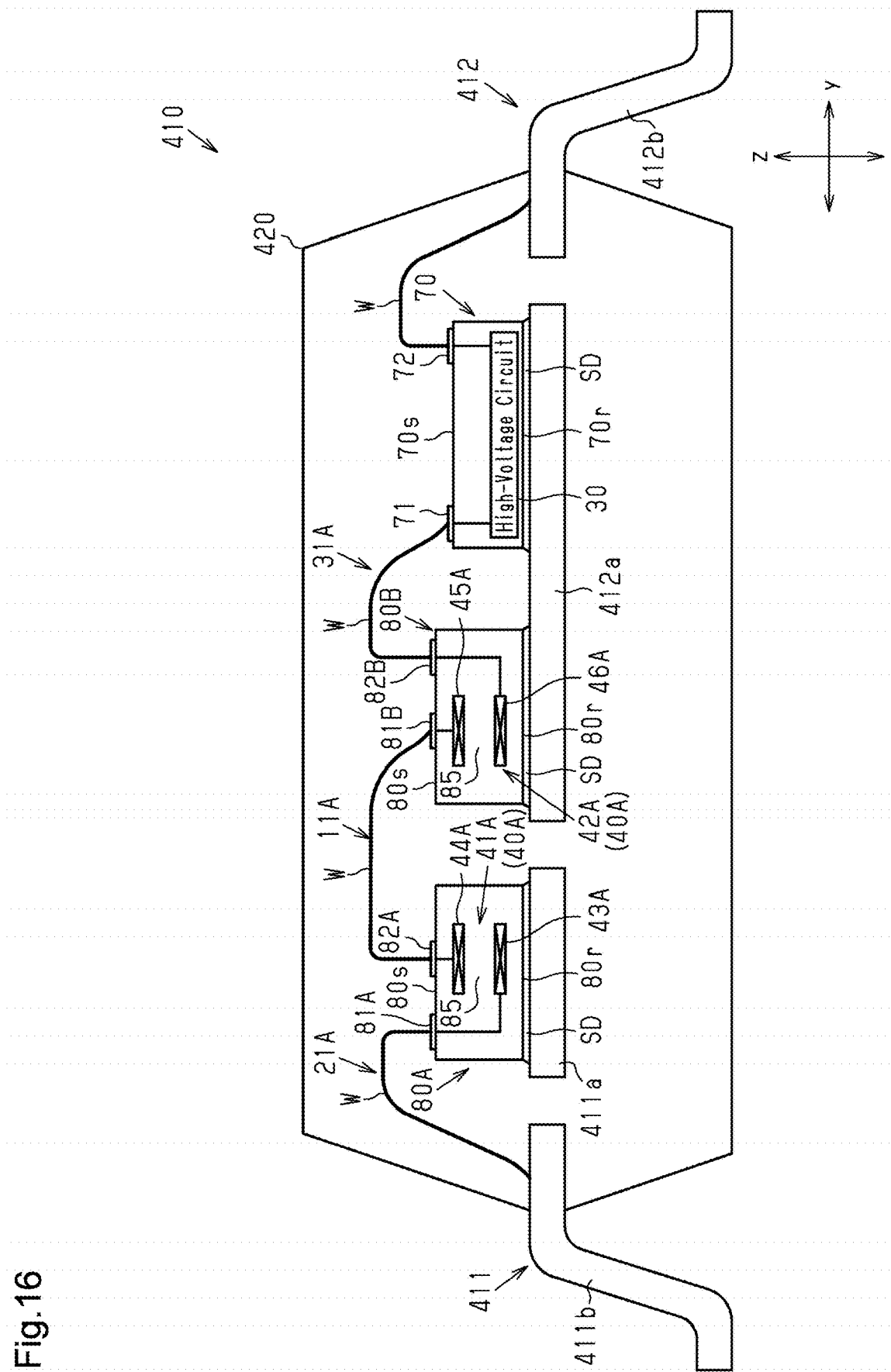
FIG. 16 is a schematic cross-sectional view of a high-voltage circuit unit in the gate driver according to the fifth embodiment.

FIG. 16 shows an example of a schematic cross-sectional structure of the high-voltage circuit unit 410. As shown in FIG. 16, the high-voltage circuit unit 410 includes a high-voltage circuit chip 70, a first transformer chip 80A, a second transformer chip 80B, a low-voltage lead frame 411, a high-voltage lead frame 412, and an encapsulation resin 420 that encapsulates a part of each of the lead frames 411 and 412 and each of the chips 70, 80A, and 80B. In other words, the high-voltage circuit unit 410 includes an insulation module that includes the transformers 40. That is, the high-voltage circuit unit 410 includes the insulation module and the high-voltage circuit 30 (refer to FIG. 15). In other words, the insulation module includes the first transformer chip 80A and the second transformer chip 80B.

The lead frames 411 and 412 are formed from a conductor and, in the fifth embodiment, are formed from Cu. The lead frames 411 and 412 are disposed to extend from the inside to the outside of the encapsulation resin 420.

The low-voltage lead frame 411 is electrically connected to the low-voltage circuit 20 (refer to FIG. 15) and includes a low-voltage die pad 411a disposed in the encapsulation resin 420 and a plurality of low-voltage leads 411b disposed to extend from the inside to the outside of the encapsulation resin 420. Each of the low-voltage leads 411b includes an external terminal electrically connected to the low-voltage circuit 20.

The high-voltage lead frame 412 is electrically connected to the high-voltage circuit 30 and includes a high-voltage die pad 412a disposed in the encapsulation resin 420 and a plurality of high-voltage leads 412b disposed to extend from the inside to the outside of the encapsulation resin 420. Each of the high-voltage leads 412b includes an external terminal electrically connected to the high-voltage circuit 30.

In the fifth embodiment, the first transformer chip 80A is mounted on the low-voltage die pad 411a. The high-voltage circuit chip 70 and the second transformer chip 80B are mounted on the high-voltage die pad 412a. The high-voltage circuit chip 70, the first transformer chip 80A, and the second transformer chip 80B are spaced apart from each other in the y-direction. In the fifth embodiment, the first transformer chip 80A, the second transformer chip 80B, and the high-voltage circuit chip 70 are arranged in this order from the low-voltage lead 411b to the high-voltage lead 412b.

The high-voltage circuit chip 70, the first transformer chip 80A, and the second transformer chip 80B are connected by wires W in the same manner as those of the first embodiment. The first electrode pads 81A of the first transformer chip 80A are connected to the low-voltage leads 411b by wires W. The fifth embodiment has the same advantages as the first embodiment.

Modified Examples

The above embodiments exemplify, without any intention to limit, applicable forms of a gate driver, an insulation module, a low-voltage circuit unit, and a high-voltage circuit unit according to the present disclosure. The gate driver, the insulation module, the low-voltage circuit unit, and the high-voltage circuit unit according to the present disclosure can be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiments. Such components will not be described in detail.

In each embodiment, the structure of the first transformer chip 80A may differ from the structure of the second transformer chip 80B. That is, the first transformer chip 80A and the second transformer chip 80B do not necessarily have to be identical to each other in structure.

When the structure of the second transformer chip 80B differs from the structure of the first transformer chip 80A, for example, the distance between the substrate main surface 84s of the substrate 84 and the second coils 46A and 46B in the z-direction may be greater than or equal to the distance D1 between the first coil 43A and the second coil 44A. In this case, the second transformer chip 80B may be mounted on the low-voltage die pad 91 (301a, 411a). That is, the first transformer chip 80A and the second transformer chip 80B may be mounted on the low-voltage die pad 91 (301a, 411a). As described above, the gate driver 10 may have a structure such that at least one of the multiple transformer chips is mounted on the low-voltage die pad 91 (301a, 411a).

When the structure of the first transformer chip 80A differs from the structure of the second transformer chip 80B, for example, the distance between the substrate main surface 84s of the substrate 84 and the first coils 43A and 43B in the z-direction may be greater than or equal to the distance D2 between the first coil 45A and the second coil 46A. In this case, the first transformer chip 80A may be mounted on the high-voltage die pad 101 (302a, 412a). That is, the first transformer chip 80A and the second transformer chip 80B may be mounted on the high-voltage die pad 101 (302a, 412a). As described above, the gate driver 10 may have a structure such that at least one of the multiple transformer chips is mounted on the high-voltage die pad 101 (302a, 412a).

In the first and third to fifth embodiments, the distance between the first coil 43A and the second coil 44A of the first transformer 41A is equal to the distance between the first coil 45A and the second coil 46A of the second transformer 42A. However, there is no limit to such a configuration. The distance between the first coil 43A and the second coil 44A may differ from the distance between the first coil 45A and the second coil 46A. Also, the first coil 43B and the second coil 44B of the first transformer 41B and the first coil 45B and the second coil 46B of the second transformer 42B may be changed in the same manner. As described above, in the first and third to fifth embodiments, the insulation voltage of the first transformer chip 80A and the insulation voltage of the second transformer chip 80B may be set to differ from each other.

In the second embodiment, the structure of the third transformer chip 80C may differ from the structure of the first transformer chip 80A (the structure of the second transformer chip 80B). That is, the first transformer chip 80A, the second transformer chip 80B, and the third transformer chip 80C do not necessarily have to be identical to each other in structure.

In the second embodiment, the distance between the first coil 43A and the second coil 44A of the first transformer 41A, the distance between the first coil 45A and the second coil 46A of the second transformer 42A, and the distance between the first coil 48A and the second coil 49A of the third transformer 47A are equal to each other. However, there is no limit to such a configuration. The distance between the first coil 43A and the second coil 44A, the distance between the first coil 45A and the second coil 46A, and the distance between the first coil 48A and the second coil 49A may differ from each other. Also, the first coil 43B and the second coil 44B of the first transformer 41B, the first coil 45B and the second coil 46B of the second transformer 42B, and the first coil 48B and the second coil 49B of the third transformer 47B may be changed in the same manner. As described above, in the second embodiment, the insulation voltage of one or two of the transformer chips 80A to 80C may be set to differ from the insulation voltage of the rest of the transformer chips 80A to 80C. Further, the insulation voltages of the transformer chips 80A to 80C may be set to differ from each other.

In the second embodiment, the third transformer chip 80C may be mounted on the low-voltage die pad 91. That is, the first transformer chip 80A and the third transformer chip 80C may be mounted on the low-voltage die pad 91. In this case, the floating die pad 50 is omitted from the gate driver 10.

In the second embodiment, the third transformer chip 80C may be mounted on the high-voltage die pad 101. That is, the second transformer chip 80B and the third transformer chip 80C may be mounted on the high-voltage die pad 101. In this case, the floating die pad 50 is omitted from the gate driver 10.

In the second embodiment, the number of transformers 40 may be four or more. In this case, a plurality of floating die pads 50 may be provided. The floating die pads 50 are disposed between the low-voltage die pad 91 and the high-voltage die pad 101 in the y-direction. In an example, the floating die pads 50 are spaced apart from each other in the y-direction.

In the second embodiment, the arrangement configuration of the first coils 48A and 48B and the second coils 49A and 49B in the third transformers 47A and 47B may be changed in any manner. In an example, the first coils 48A and 48B may be disposed farther away from the substrate 84 than the second coils 49A and 49B are.

In each embodiment, the arrangement configuration of the first coils 43A and 43B and the second coils 44A and 44B in the first transformers 41A and 41B may be changed in any manner. In an example, the first coils 43A and 43B may be disposed further away from the substrate 84 than the second coils 44A and 44B are.

In each embodiment, the arrangement configuration of the first coils 45A and 45B and the second coils 46A and 46B in the second transformers 42A and 42B may be changed in any manner. In an example, the first coils 45A and 45B may be disposed closer to the substrate 84 than the second coils 46A and 46B are.

In the third embodiment, the first transformer chip 80A may be mounted on the high-voltage die pad 222a. That is, the first transformer chip 80A and the second transformer chip 80B may be mounted on the high-voltage die pad 222a.

In the third embodiment, the second transformer chip 80B may be mounted on the low-voltage die pad 221a. That is, the first transformer chip 80A and the second transformer chip 80B may be mounted on the low-voltage die pad 221a.

The structure of the transformer 40 in the second embodiment may be applied to the third embodiment. More specifically, the insulation module 220 may include the first transformer chip 80A, the second transformer chip 80B, and the third transformer chip 80C. Thus, the insulation module 220 may include three or more transformer chips.

The structure of the transformer 40 in the second embodiment may be applied to the fourth embodiment. More specifically, the low-voltage circuit unit 300 may include the first transformer chip 80A, the second transformer chip 80B, and the third transformer chip 80C. Thus, the low-voltage circuit unit 300 may include three or more transformer chips.

The structure of the transformer 40 in the second embodiment may be applied to the fifth embodiment. More specifically, the high-voltage circuit unit 410 may include the first transformer chip 80A, the second transformer chip 80B, and the third transformer chip 80C. Thus, the high-voltage circuit unit 410 may include three or more transformer chips.

In each embodiment, the first dummy pattern 121 of the dummy pattern 120 is electrically connected to the second coil 44B. However, there is no limit to such a configuration. In an example, the first dummy pattern 121 may be arranged independently of the second coils 44A and 44B. In other words, the first dummy pattern 121 may be configured not to be electrically connected to the second coils 44A and 44B.

In each embodiment, the third dummy pattern 123 is electrically connected to the first dummy pattern 121. However, there is no limit to such a configuration. In an example, the third dummy pattern 123 may be configured not to be electrically connected to the first dummy pattern 121. In the first transformer chip 80A, a voltage applied to the dummy patterns 121 to 123 may be greater than a voltage applied to the first coils 43A and 43B. Also, the dummy pattern 130 may be changed in the same manner as the dummy pattern 120.

In each embodiment, the structure of the dummy pattern 120 in the first transformer chip 80A may be changed in any manner. In an example, one or two of the first dummy pattern 121, the second dummy pattern 122, and the third dummy pattern 123 may be omitted from the dummy pattern 120. In each embodiment, the dummy pattern 120 may be omitted from the first transformer chip 80A.

In each embodiment, the structure of the dummy pattern 130 in the second transformer chip 80B may be changed in any manner. In an example, one or two of the first dummy pattern 131, the second dummy pattern 132, and the third dummy pattern 133 may be omitted from the dummy pattern 130. In each embodiment, the dummy pattern 130 may be omitted from the second transformer chip 80B.

Figure 17:
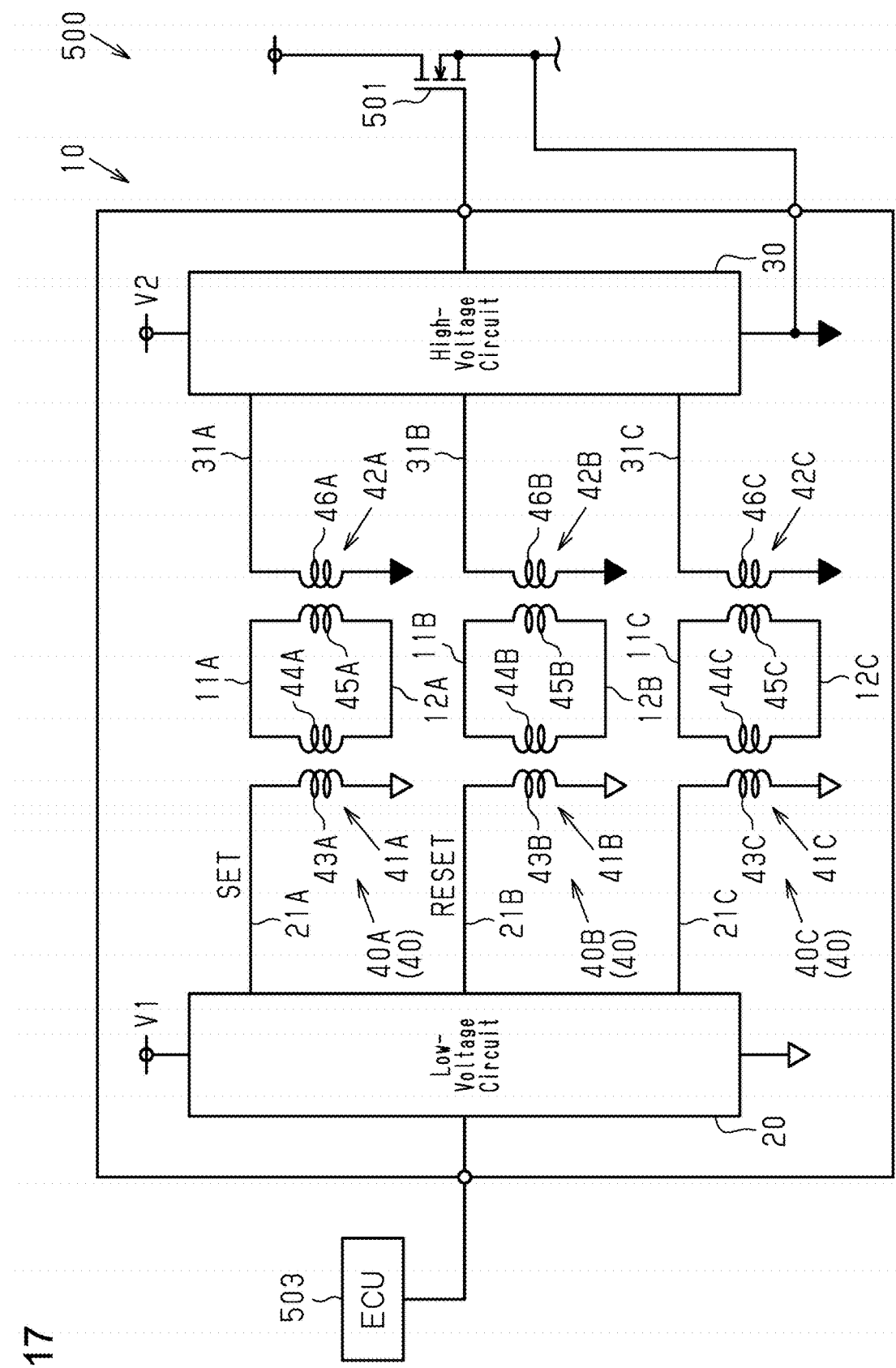
FIG. 17 is a schematic circuit diagram showing a modified example of a gate driver.

In each embodiment, the gate driver 10 may transmit a signal from the high-voltage circuit 30 to the low-voltage circuit 20 through multiple transformer chips. As shown in FIG. 17, an example of a structure in which the gate driver 10 of the first embodiment further includes a signal path for transmitting a signal from the high-voltage circuit 30 to the low-voltage circuit 20 will be described.

As shown in FIG. 17, the gate driver 10 includes a transformer 40C configured to transmit a signal from the high-voltage circuit 30 to the low-voltage circuit 20. The transformer 40C insulates the high-voltage circuit 30 from the low-voltage circuit 20 while transmitting a signal from the high-voltage circuit 30 toward the low-voltage circuit 20. An example of the signal is an anomaly detection signal that is output when an anomaly of the switching element 501 is detected. Examples of the anomaly of the switching element 501 include an anomaly (temperature anomaly) such that the temperature of the switching element 501 excessively increases, an anomaly (overcurrent) such that an excessively large current flows to the switching element 501, and an anomaly (overvoltage) such that an excessively high voltage is applied to the switching element 501. That is, the gate driver 10 transmits an anomaly detection signal from the high-voltage circuit 30 to the low-voltage circuit 20 through the transformer 40C when a temperature anomaly, an overcurrent, an excess voltage of the switching elements 501 or the like is detected.

The transformer 40C includes a first transformer 41C and a second transformer 42C. The first transformer 41C, which has the same structure as the first transformers 41A and 41B, includes a first coil 43C and a second coil 44C. The second transformer 42C, which has the same structure as the second transformers 42A and 42B, includes a first coil 45C and a second coil 46C.

The first coil 43C is connected to a low-voltage signal line 21C connected to the low-voltage circuit 20. The first coil 43C is also connected to the ground of the low-voltage circuit 20. The second coil 44C and the first coil 45C are connected by connection signal lines 11C and 12C. The second coil 46C is connected to a high-voltage signal line 31C connected to the high-voltage circuit 30. The second coil 46C is also connected to the ground of the high-voltage circuit 30.

A signal output from the high-voltage circuit 30 is transmitted through the second transformer 42C and the first transformer 41C to the low-voltage circuit 20. In the illustrated example, the second transformer 42C and the first transformer 41C are arranged in this order in a direction in which the signal is transmitted.

As described above, in the modified example shown in FIG. 17, signals are transmitted bidirectionally between the low-voltage circuit 20 and the high-voltage circuit 30. The signals include a first signal transmitted from the low-voltage circuit 20 toward the high-voltage circuit 30 and a second signal transmitted from the high-voltage circuit 30 toward the low-voltage circuit 20. The first signal is transmitted from the low-voltage circuit 20 to the high-voltage circuit 30 through the first transformer 41A (41B) and then the second transformer 42A (42B). The second signal is transmitted from the high-voltage circuit 30 to the low-voltage circuit 20 through the second transformer 42C and then the first transformer 41C.

Figure 18:
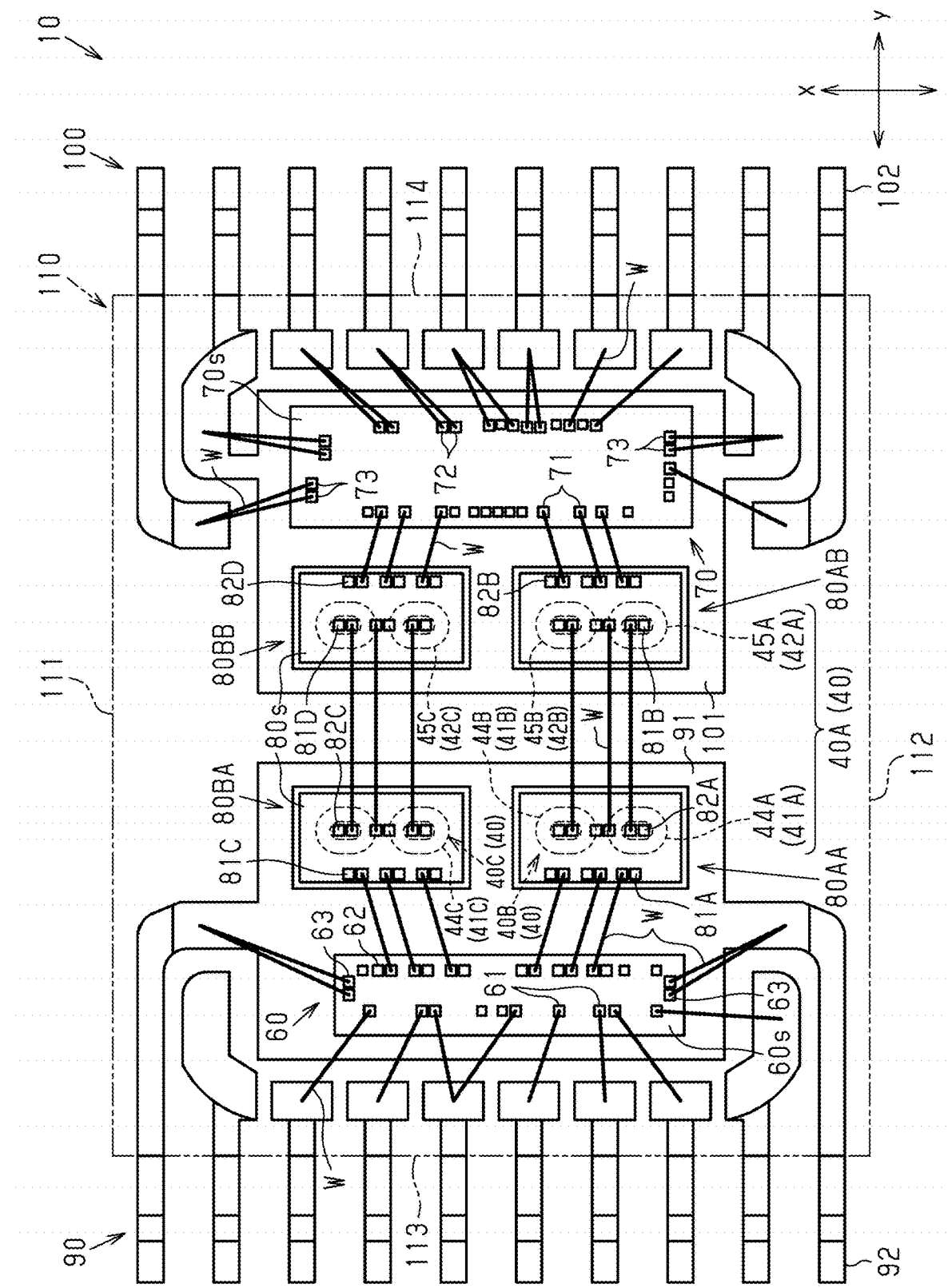
FIG. 18 is a plan view showing an internal structure of the gate driver shown in FIG. 17.

FIG. 18 is an example of a schematic plan view showing an internal structure of the gate driver 10 shown in FIG. 17.

The multiple transformer chips of the gate driver 10 include multiple first signal transformer chips connected in series to each other and multiple second signal transformer chips connected in series to each other. In the illustrated example, the multiple transformer chips include first signal transformer chips 80AA and 80AB, corresponding to multiple first signal transformer chips that transmit a set signal and a reset signal, and second signal transformer chips 80BA and 80BB, corresponding to multiple second signal transformer chips that transmit an anomaly detection signal.

In the illustrated example, the first signal transformer chip 80AA and the second signal transformer chip 80BA are mounted on the low-voltage die pad 91, and the first signal transformer chip 80AB and the second signal transformer chip 80BB are mounted on the high-voltage die pad 101.

The low-voltage circuit chip 60, the high-voltage circuit chip 70, and the first signal transformer chips 80AA and 80AB are arranged in the order of the low-voltage circuit chip 60, the first signal transformer chip 80AA, the first signal transformer chip 80AB, and the high-voltage circuit chip 70 in the y-direction from the low-voltage leads 92 toward the high-voltage leads 102. The low-voltage circuit chip 60, the high-voltage circuit chip 70, and the second signal transformer chips 80BA and 80BB are arranged in the order of the low-voltage circuit chip 60, the second signal transformer chip 80BA, the second signal transformer chip 80BB, and the high-voltage circuit chip 70 in the y-direction from the low-voltage leads 92 toward the high-voltage leads 102.

The first signal transformer chip 80AA and the second signal transformer chip 80BA are aligned with each other in the y-direction and spaced apart from each other in the x-direction. The first signal transformer chip 80AB and the second signal transformer chip 80BB are aligned with each other in the y-direction and spaced apart from each other in the x-direction.

In the illustrated example, in plan view, the distance between the first signal transformer chip 80AA and the first signal transformer chip 80AB is greater than each of the distance between the low-voltage circuit chip 60 and the first signal transformer chip 80AA and the distance between the high-voltage circuit chip 70 and the first signal transformer chip 80AB. In plan view, the distance between the second signal transformer chip 80BA and the second signal transformer chip 80BB is greater than each of the distance between the low-voltage circuit chip 60 and the second signal transformer chip 80BA and the distance between the high-voltage circuit chip 70 and the second signal transformer chip 80BB.

The first signal transformer chip 80AA includes first transformers 41A and 41B. The first signal transformer chip 80AB includes second transformers 42A and 42B.

The arrangement relationship of the first coils 43A and 43B and the second coils 44A and 44B in the first signal transformer chip 80AA is similar to the arrangement relationship of the first coils 43A and 43B and the second coils 44A and 44B in the first transformer chip 80A. The arrangement relationship of the first coils 45A and 45B and the second coils 46A and 46B in the first signal transformer chip 80AB is similar to the arrangement relationship of the first coils 45A and 45B and the second coils 46A and 46B in the second transformer chip 80B. In the same manner as the first embodiment, the first transformer 41A and the second transformer 42A are connected to each other in series, and the first transformer 41B and the second transformer 42B are connected to each other in series.

The second signal transformer chip 80BA includes the first transformer 41C, and the second signal transformer chip 80BA includes the second transformer 42C.

Although not illustrated, the second signal transformer chip 80BA includes a substrate, an insulation layer formed on the substrate, and the first coil 43C and the second coil 44C of the first transformer 41C embedded in the insulation layer and opposed to each other in the z-direction. The structure of the second signal transformer chip 80BA is, for example, the same as the structure of the first transformer chip 80A. The second coil 44C is located farther away from the substrate than the first coil 43C is. In other words, the first coil 43C is located closer to the substrate than the second coil 44C is. The distance between the first coil 43C and the second coil 44C in the z-direction is, for example, equal to the distance between the first coil 43A and the second coil 44A of the first transformer 41A in the z-direction.

Although not illustrated, the second signal transformer chip 80BB includes a substrate, an insulation layer formed on the substrate, and the first coil 45C and the second coil 46C of the second transformer 42C embedded in the insulation layer and opposed to each other in the z-direction. The structure of the second signal transformer chip 80BB is, for example, the same as the structure of the second transformer chip 80B. The first coil 45C is located farther away from the substrate than the second coil 46C is. In other words, the second coil 46C is located closer to the substrate than the first coil 45C is. The distance between the first coil 45C and the second coil 46C in the z-direction is, for example, equal to the distance between the first coil 45A and the second coil 46A of the second transformer 42A in the z-direction.

The chip main surface 80s of the second signal transformer chip 80BA includes the first electrode pads 81C and the second electrode pads 82C. The chip main surface 80s of the second signal transformer chip 80BB includes first electrode pads 81D and second electrode pads 82D.

The first electrode pads 81C of the second signal transformer chip 80BA are electrically connected to the first coil 43C of the first transformer 41C. The second electrode pads 82C are electrically connected to the second coil 44C of the first transformer 41C.

The first electrode pads 81D of the second signal transformer chip 80BB are electrically connected to the first coil 45C of the second transformer 42C. The second electrode pads 82D are electrically connected to the second coil 46C of the second transformer 42C.

The first electrode pads 81C of the second signal transformer chip 80BA are individually connected to the first electrode pads 61 of the low-voltage circuit chip 60 by wires W. This electrically connects the first coil 43C and the low-voltage circuit 20.

The second electrode pads 82C of the second signal transformer chip 80BA are individually connected to the first electrode pads 81D of the second signal transformer chip 80BB by wires W. This electrically connects the second coil 44C of the first transformer 41C and the first coil 45C of the second transformer 42C.

The second electrode pads 82D of the second signal transformer chip 80BB are individually connected to the first electrode pads 71 of the high-voltage circuit chip 70 by wires W. This electrically connects the second coil 46C and the high-voltage circuit 30.

The low-voltage circuit chip 60 is connected to the first signal transformer chip 80AA and the second signal transformer chip 80BA by wires W. The first signal transformer chip 80AA and the first signal transformer chip 80AB are connected by wires W. The second signal transformer chip 80BA and the second signal transformer chip 80BB are connected by wires W. The first signal transformer chip 80AB and the second signal transformer chip 80BB are connected to the high-voltage circuit chip 70 by wires W.

With this structure, the set signal and the reset signal, which are the first signals output from the low-voltage circuit 20, are transmitted to the high-voltage circuit 30 through the first signal transformer chip 80AA and then the first signal transformer chip 80AB. The anomaly detection signal, which is the second signal output from the high-voltage circuit 30, is transmitted to the low-voltage circuit 20 through the second signal transformer chip 80BB and then the second signal transformer chip 80BA.

In the present disclosure, the term "on" includes the meaning of "above" in addition to the meaning of "on" unless otherwise clearly indicated in the context. Thus, the phrase "A is formed on B" is intended to mean that A may be disposed directly on B in contact with B in an embodiment and also that A may be disposed above B without contacting B in a modified example. In other words, the term "on" does not exclude a structure in which another member is formed between A and B.

The z-direction as referred to in the present disclosure does not necessarily have to be the vertical direction and does not necessarily have to fully conform to the vertical direction. In the structures according to the present disclosure, "upward" and "downward" in the z-direction as referred to in the present description are not limited to "upward" and "downward" in the vertical direction. In an example, the x-direction may conform to the vertical direction. In another example, the y-direction may conform to the vertical direction.

Clauses

The technical aspects that are understood from the embodiments and the modified examples will be described below. The reference signs of the elements in the embodiments are given to the corresponding elements in clauses with parentheses. The reference signs used as examples to facilitate understanding, and the elements in each clause are not limited to those elements given with the reference signs.

[Clause 1] A gate driver (10) that is configured to apply a drive voltage signal to a gate of a switching element (501), the gate driver including:
a low-voltage circuit chip (60) including a low-voltage circuit (20) configured to be actuated by application of a first voltage (V1);
a high-voltage circuit chip (70) including a high-voltage circuit (30) configured to be actuated by application of a second voltage (V2) that is higher than the first voltage (V1); and
multiple transformer chips (80A, 80B) connected in series to each other,
where the low-voltage circuit chip (60) and the high-voltage circuit chip (70) are connected by the multiple transformer chips (80A, 80B) and configured to transmit a signal through the multiple transformer chips (80A, 80B).

[Clause 2] The gate driver according to clause 1, where the multiple transformer chips (80A, 80B) are arranged next to each other between the low-voltage circuit chip (60) and the high-voltage circuit chip (70).

[Clause 3] The gate driver according to clause 1 or 2, further including:
a low-voltage die pad (91) on which the low-voltage circuit chip (60) is mounted; and
a high-voltage die pad (101) on which the high-voltage circuit chip (70) is mounted, where the multiple transformer chips include a first transformer chip (80A) and a second transformer chip (80B),
the first transformer chip (80A) is mounted on the low-voltage die pad (91), and
the second transformer chip (80B) is mounted on the high-voltage die pad (101).

[Clause 4] The gate driver according to clause 3, where the first transformer chip (80A) and the second transformer chip (80B) are separated from each other by a distance that is greater than each of a distance between the first transformer chip (80A) and the low-voltage circuit chip (60) and a distance between the second transformer chip (80B) and the high-voltage circuit chip (70).

[Clause 5] The gate driver according to clause 1 or 2, where
the multiple transformer chips include three or more transformer chips (80A, 80B, 80C),
the gate driver (10) further includes a floating die pad (50) that is electrically floating, and
at least one of the three or more transformer chips (80A, 80B, 80C) is mounted on the floating die pad (50).

[Clause 6] The gate driver according to any one of clauses 1 to 5, where each of the multiple transformer chips (80A, 80B) includes
an insulation layer (85), and
a first coil (43A, 43B, 45A, 45B) and a second coil (44A, 44B, 46A, 46B) embedded in the insulation layer (85) and opposed to each other in a thickness-wise direction (z-direction) of the insulation layer (85).

[Clause 7] The gate driver according to clause 6, where the multiple transformer chips (80A, 80B) are equal to each other in a distance (D1, D2) between the first coil (43A, 43B, 45A, 45B) and the second coil (44A, 44B, 46A, 46B).

[Clause 8] The gate driver according to clause 6 or 7, where the first coil (43A, 43B, 45A, 45B) and the second coil (44A, 44B, 46A, 46B) are formed from a material including Cu.

[Clause 9] The gate driver according to any one of clauses 6 to 8, where
each of the transformer chips (80A, 80B) includes a chip main surface (80s) and a chip back surface (80r) facing opposite directions in the thickness-wise direction (z-direction) of the insulation layer (85), and
a dummy pattern (120, 130) is formed around one (44A, 44B, 45A, 45B) of the first coil (43A, 43B, 45A, 45B) and the second coil (44A, 44B, 46A, 46B) that is located closer to the chip main surface (80s).

[Clause 10] The gate driver according to any one of clauses 1 to 9, where
the multiple transformer chips (80A, 80B) are identical to each other in structure.

[Clause 11] The gate driver according to any one of clauses 1 to 10, where
the signal includes a first signal,
the low-voltage circuit (20) is configured to output the first signal for generating the drive voltage signal based on an external instruction,
the first signal output from the low-voltage circuit (20) is transmitted through the multiple transformer chips (80A, 80B) to the high-voltage circuit (30), and
the high-voltage circuit (30) is configured to generate the drive voltage signal based on the first signal from the low-voltage circuit (20).

[Clause 12] The gate driver according to any one of clauses 1 to 10, where
the signal includes a first signal and a second signal,
the multiple transformer chips (80A, 80B) include multiple first signal transformer chips (80AA, 80AB) connected in series to each other, and multiple second signal transformer chips (80BA, 80BB) connected in series to each other, the first signal is transmitted from the low-voltage circuit (20) to the high-voltage circuit (30) through the multiple first signal transformer chips (80AA, 80AB), and the second signal is transmitted from the high-voltage circuit (30) to the low-voltage circuit (20) through the multiple second signal transformer chips (80BA, 80BB).

[Clause 13] An insulation module (220) used to insulate a low-voltage circuit (20) from a high-voltage circuit (30), the low-voltage circuit (20) and the high-voltage circuit (30) being included in a gate driver (10) that is configured to apply a drive voltage signal to a gate of a switching element (501), the insulation module (220) including:

multiple transformer chips (80A, 80B) connected in series to each other, where the low-voltage circuit (20) and the high-voltage circuit (30) are configured to be connected by the multiple transformer chips (80A, 80B), and the multiple transformer chips (80A, 80B) are used to transmit a signal between the low-voltage circuit (20) and the high-voltage circuit (30).

[Clause 14] A low-voltage circuit unit, including:
the insulation module (220) according to clause 13; and
the low-voltage circuit (20).

[Clause 15] A high-voltage circuit unit, including:
the insulation module (220) according to clause 13; and
the high-voltage circuit (30).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A gate driver that is configured to apply a drive voltage signal to a gate of a switching element, the gate driver comprising:
   a low-voltage circuit chip including a low-voltage circuit configured to be actuated by application of a first voltage;
   a high-voltage circuit chip including a high-voltage circuit configured to be actuated by application of a second voltage that is higher than the first voltage; and
   multiple transformer chips connected in series to each other, wherein
   the low-voltage circuit chip and the high-voltage circuit chip are connected by the multiple transformer chips and configured to transmit a signal through the multiple transformer chips, and
   each of the multiple transformer chips includes
      an insulation layer, and
      a first coil and a second coil embedded in the insulation layer and opposed to each other in a thickness-wise direction of the insulation layer.

2. The gate driver according to claim 1, wherein the multiple transformer chips are arranged next to each other between the low-voltage circuit chip and the high-voltage circuit chip.

3. The gate driver according to claim 1, further comprising:
   a low-voltage die pad on which the low-voltage circuit chip is mounted; and
   a high-voltage die pad on which the high-voltage circuit chip is mounted, wherein
   the multiple transformer chips include a first transformer chip and a second transformer chip,
   the first transformer chip is mounted on the low-voltage die pad, and
   the second transformer chip is mounted on the high-voltage die pad.

4. The gate driver according to claim 3, wherein the first transformer chip and the second transformer chip are separated from each other by a distance that is greater than each of a distance between the first transformer chip and the low-voltage circuit chip and a distance between the second transformer chip and the high-voltage circuit chip.

5. The gate driver according to claim 1, wherein
   the multiple transformer chips include three or more transformer chips,
   the gate driver further includes a floating die pad that is electrically floating, and
   at least one of the three or more transformer chips is mounted on the floating die pad.

6. The gate driver according to claim 1, wherein the multiple transformer chips are equal to each other in a distance between the first coil and the second coil.

7. The gate driver according to claim 1, wherein the first coil and the second coil are formed from a material including Cu.

8. The gate driver according to claim 1, wherein
   each of the transformer chips includes a chip main surface and a chip back surface facing opposite directions in the thickness-wise direction of the insulation layer, and
   a dummy pattern is formed around one of the first coil and the second coil that is located closer to the chip main surface.

9. The gate driver according to claim 1, wherein the multiple transformer chips are identical to each other in structure.

10. The gate driver according to claim 1, wherein
    the signal includes a first signal,
    the low-voltage circuit is configured to output the first signal for generating the drive voltage signal based on an external instruction,
    the first signal output from the low-voltage circuit is transmitted through the multiple transformer chips to the high-voltage circuit, and
    the high-voltage circuit is configured to generate the drive voltage signal based on the first signal from the low-voltage circuit.

11. The gate driver according to claim 1, wherein
    the signal includes a first signal and a second signal,
    the multiple transformer chips include
       multiple first signal transformer chips connected in series to each other, and
       multiple second signal transformer chips connected in series to each other,
    the first signal is transmitted from the low-voltage circuit to the high-voltage circuit through the multiple first signal transformer chips, and the second signal is transmitted from the high-voltage circuit to the low-voltage circuit through the multiple second signal transformer chips.

12. The gate driver according to claim 1, wherein
one coil of the first and second coils in a first transformer chip of the multiple transformer chips is connected to the low-voltage circuit, and
one coil of the first and second coils in a second transformer chip of the multiple transformer chips is connected to the high-voltage circuit.

13. An insulation module used to insulate a low-voltage circuit from a high-voltage circuit, the low-voltage circuit and the high-voltage circuit being included in a gate driver that is configured to apply a drive voltage signal to a gate of a switching element, the insulation module comprising:
multiple transformer chips connected in series to each other, wherein
the low-voltage circuit and the high-voltage circuit are configured to be connected by the multiple transformer chips,
the multiple transformer chips are used to transmit a signal between the low-voltage circuit and the high-voltage circuit, and
each of the multiple transformer chips includes
an insulation layer, and
a first coil and a second coil embedded in the insulation layer and opposed to each other in a thickness-wise direction of the insulation layer.

14. A low-voltage circuit unit, comprising:
the insulation module according to claim 13; and
the low-voltage circuit.

15. A high-voltage circuit unit, comprising:
the insulation module according to claim 13; and
the high-voltage circuit.

\* \* \* \* \*